US012426383B2

(12) United States Patent
Jones et al.

(10) Patent No.: US 12,426,383 B2
(45) Date of Patent: Sep. 23, 2025

(54) SEMICONDUCTOR SYSTEM WITH WAVEGUIDE ASSEMBLY WITH RF SIGNAL IMPEDANCE CONTROLLABLE BY APPLIED ELECTROMAGNETIC RADIATION

(71) Applicants: Purdue Research Foundation, West Lafayette, IN (US); The Governors of the University of Alberta, Edmonton (CA)

(72) Inventors: Thomas R. Jones, Edmonton (CA); Dimitrios Peroulis, West Lafayette, IN (US); Alden N. Fisher, West Lafayette, IN (US); Douglas W Barlage, Edmonton (CA)

(73) Assignees: Purdue Research Foundation, West Lafayette, IN (US); The Governors of the University of Alberta, Edmonton (CA)

( * ) Notice: Subject to any disclaimer, the term of this patent is extended or adjusted under 35 U.S.C. 154(b) by 0 days.

(21) Appl. No.: 19/096,554

(22) Filed: Mar. 31, 2025

(65) Prior Publication Data

US 2025/0228015 A1    Jul. 10, 2025

Related U.S. Application Data

(63) Continuation of application No. 18/506,083, filed on Nov. 9, 2023, which is a continuation of application No. PCT/CA2022/050728, filed on May 9, 2022.
(Continued)

(51) Int. Cl.
*H10F 30/10* (2025.01)
*H01P 11/00* (2006.01)
(Continued)

(52) U.S. Cl.
CPC ........... *H10F 30/10* (2025.01); *H01P 11/002* (2013.01); *H10F 71/121* (2025.01); *H10F 77/93* (2025.01); *H10F 77/147* (2025.01)

(58) Field of Classification Search
CPC ........ H10F 30/10; H10F 77/93; H10F 71/121; H10F 77/147; H01P 11/002
(Continued)

(56) References Cited

U.S. PATENT DOCUMENTS 6,531,068 B2     3/2003   Laermer et al.
8,873,339 B2 *  10/2014   Chen .................... G06F 1/10
                                                                342/464
(Continued)

FOREIGN PATENT DOCUMENTS

EP         3 612 891 B1      4/2021

OTHER PUBLICATIONS

International Search Report and Written Opinion mailed Aug. 10, 2022 in connection with International Application No. PCT/CA2022/050728.
(Continued)

*Primary Examiner* — Bo Fan
(74) *Attorney, Agent, or Firm* — Wolf, Greenfield & Sacks, P.C.

(57) ABSTRACT

A waveguide assembly integrated with a semiconductor wafer is provided. The waveguide assembly includes a waveguide channel defined by internal walls of the wafer lined with a metallic layer, and having at least one port for transmission of the RF signal into or out of the waveguide channel. The waveguide assembly also includes a semiconductor obstacle member disposed in the waveguide channel. The waveguide assembly may be fabricated using etching and deposition processes for semiconductor devices. In use, selectively varying either one or both of frequency or power
(Continued)

level of electromagnetic radiation applied to the obstacle member varies electrical conductance of the obstacle member, and thereby varies the electrical impedance of the obstacle member to transmission of the RF signal through the waveguide channel. The waveguide assembly may be used for switching, attenuating, routing, filtering, and transforming the RF signal.

20 Claims, 15 Drawing Sheets

Related U.S. Application Data

(60) Provisional application No. 63/186,658, filed on May 10, 2021.

(51) Int. Cl.
  *H10F 71/00* (2025.01)
  *H10F 77/00* (2025.01)
  *H10F 77/14* (2025.01)

(58) Field of Classification Search
  USPC .......... 342/61, 112, 124, 129, 175, 372, 412
  See application file for complete search history.

(56) References Cited

U.S. PATENT DOCUMENTS

| | | | |
|---|---|---|---|
| 2003/0039430 A1 | 2/2003 | Deliwala | |
| 2004/0256349 A1 | 12/2004 | Leib et al. | |
| 2007/0290921 A1* | 12/2007 | Hackner | H04B 13/02 342/372 |
| 2010/0012318 A1* | 1/2010 | Luce | E21B 43/04 166/278 |
| 2012/0092086 A1 | 4/2012 | Hernandez | |
| 2016/0036111 A1* | 2/2016 | Gregoire | H01Q 13/00 333/240 |
| 2020/0294940 A1 | 9/2020 | Dogiamis et al. | |
| 2024/0145612 A1 | 5/2024 | Jones et al. | |

OTHER PUBLICATIONS

International Preliminary Report on Patentability mailed Nov. 23, 2023 in connection with International Application No. PCT/CA2022/050728.
Extended European Search Report dated Apr. 3, 2025 in connection with European Application No. 22806149.5.
[No Author Listed], Waveguide Pin Switches—Double Throw QSS/QSD Series. QuinStar Technology Inc. https://quinstar.com/shop/uncategorized/ka-band-solid-state-power-amplifier-qbp-35065350/ [last accessed Feb. 1, 2021].
https://quinstar.com/shop/uncategorized/ka-band-solid-state-power-amplifier-qbp-35065350/ [last accessed Feb. 1, 2021].
Baghchehsaraei et al., Parameter analysis of millimeter-wave waveguide switch based on a MEMS-reconfigurable surface. IEEE Transactions on Microwave Theory and Techniques, Dec. 2013;61(12):4396-406.
Campion, et al., Toward industrial exploitation of THz frequencies: integration of SiGe MMICs in silicon-micromachined waveguide systems. IEEE Transactions on Terahertz Science and Technology, Nov. 2019;9(6):624-36.
Chen et al., RF design, power handling, and hot switching of waveguide water-based absorptive switches. IEEE Trans. Microw. Theory Tech., Aug. 2009;57(8);2038-46.

Craven et al., The design of evanescent mode waveguide bandpass filters for a prescribed insertion loss characteristic. IEEE Trans. Microw. Theory Tech., Mar. 1971;19(3):295-308.
Fisher et al., A fiber-free DC-7GHz 35W integrated semiconductor plasma switch. IEEE International Microwave Symposium, Jun. 2021:27-30.
Gamlath et al., Microwave properties of an inhomogeneous optically illuminated plasma in a microstrip gap. IEEE Trans. Microw. Theory Tech. Feb. 2015;63(2):374-83.
Kannegulla et al., Photo-induced spatial modulation of THz waves: opportunities and limitations. Opt. Express. Dec. 4, 2015;23(25):32098-112.
Kowalczuk et al., Design and Operation Influences Regarding Rise and Fall Time of a Photoconductive Microwave Switch. 2013 Loughborough Antennas & Propagation Conference (LAPC), Loughborough, UK, Nov. 2013, pp. 149-154, doi: 10.1109/LAPC.2013.6711871.
Krivovitca et al., Micromachined 20 silicon-core substrate-integrated waveguides at 220-330 GHz. IEEE Trans. Microw. Theory Tech., Dec. 2020:68(12):5123-31.
Lee et al., Optical Control of Millimeter-Wave Propagation in Dielectric Waveguides. IEEE J. Quantum Electron., 1980;QE-16(3):277-88.
Neamen, Semiconductor Physics and Devices; Basic Principles. 2012; 4th Ed. New York: McGraw-Hill. 784 pages.
Pang et al., An optically controlled coplanar waveguide millimeter-wave switch. IEEE Microw. Wirel. Components Lett., 2018;28((8):669-71.
Pang et al., Nonlinearity and Power Handling Characterization of an Optically Reconfigurable Microwave Switch. IEEE MTT-S International Microwave Symposium Digest. Jun. 2018;pp. 420-2.
Pelliccia et al., High-Q tunable waveguide filters using ohmic RF MEMS switches. IEEE Transactions on Microwave Theory and Techniques, Oct. 2015;63(10):3381-90.
Psychogiou et al., Millimeter-wave phase shifter based on waveguide-mounted RF-MEMS. Microw. Opt. Technol. Lett., Mar. 2013;55(3):465-68.
Rebeiz, RF MEMS Theory, Design, and Technology. IEEE Electrical Insulation Magazine, 2004;20(6):65.
Ren et al., High-performance WR-4.3 optically controlled variable attenuator with 60-dB range. IEEE Microw. Wirel. Components Lett., Jun. 2018;28(6):512-4.
Rizzi, Microwave Engineering: Passive Circuits. Book in New Jersey: Prentice Hall; 1988; 598 pages.
Shah et al., A 500-750 GHz RF MEMS waveguide switch. IEEE Trans. Terahertz Sci. Technol., May 2017;7(3):326-34.
Shehab et al., Substrate-integrated-waveguide power dividers. IEEE Antennas Propag. Mag., Aug. 2020;62(4):27-38.
Sickel et al., An in situ tunable diode mounting topology for high-power X-band waveguide switches. IEEE Trans. Microw. Theory Tech., Feb. 2007;55(2):281-5.
Sze, Semiconductor Devices: Physics and Technology. 2nd Edition. New York: John Wiley & Sons, Inc. 2002, 590 pages.
Vahabisani et al., Monolithic millimeter-wave MEMS waveguide switch. IEEE Trans. Microw. Theory Tech., Feb. 2015;63(2):340-51.
Ben Ali et al., Photo-Induced Coplanar Waveguide RF Switch and Optical Crosstalk on High-Resistivity Silicon Trap-Rich Passivated Substrate. IEEE Transactions on Electron Devices, Oct. 2013;60(10):3478-84.
Platte, Optoelectronic Microwave Switching via Laser-Induced Plasma Tapers in GaAs Microstrip Sections. IEEE Transactions on Microwave Theory and Techniques, Oct. 1981;MTT-29(10):1010-8.
Shepeleva et al., Integrated W-Band Photoconductive Switches in SIW Technology. IEEE Microwave and Wireless Components Lett., Jul. 2021;31(7):865-8.

* cited by examiner $C_D \equiv$ Semiconductor obstacle dark state shunt capacitance
$Z_H \equiv$ Characteristic impedance of the high impedance waveguide section
$\beta \equiv$ Propagation constant of the high impedance waveguide section
$l \equiv$ Transmission line length of the high impedance waveguide section $C_D \equiv$ Semiconductor obstacle dark state shunt capacitance
$Z_H \equiv$ Characteristic impedance of the high impedance waveguide section
$\beta \equiv$ Propagation constant of the high impedance waveguide section
$l \equiv$ Transmission line length of the high impedance waveguide section

SEMICONDUCTOR SYSTEM WITH WAVEGUIDE ASSEMBLY WITH RF SIGNAL IMPEDANCE CONTROLLABLE BY APPLIED ELECTROMAGNETIC RADIATION

CROSS-REFERENCE TO RELATED APPLICATIONS

This application is a continuation claiming the benefit of U.S. application Ser. No. 18/506,083, filed Nov. 9, 2023, and entitled "SEMICONDUCTOR SYSTEM WITH WAVEGUIDE ASSEMBLY WITH RF SIGNAL IMPEDANCE CONTROLLABLE BY APPLIED ELECTROMAGNETIC RADIATION," which is hereby incorporated herein by reference in its entirety.

U.S. application Ser. No. 18/506,083, is a continuation claiming the benefit of International Patent Application Serial No. PCT/CA2022/050728, filed May 9, 2022, and entitled "SEMICONDUCTOR SYSTEM WITH WAVEGUIDE ASSEMBLY WITH RF SIGNAL IMPEDANCE CONTROLLABLE BY APPLIED ELECTROMAGNETIC RADIATION," which is hereby incorporated herein by reference in its entirety.

International Patent Application Serial No. PCT/CA2022/050728 claims the benefit under 35 U.S.C 119 (e) of U.S. provisional patent application No. 63/186,658, filed on May 10, 2021, titled "SEMICONDUCTOR SYSTEM WITH WAVEGUIDE ASSEMBLY WITH RF SIGNAL IMPEDANCE CONTROLLABLE BY APPLIED ELECTROMAGNETIC RADIATION," which is hereby incorporated herein by reference in its entirety.

FIELD

The present invention relates to a waveguide assembly in a semiconductor wafer, its fabrication using microfabrication processes, and methods of controlling the waveguide assembly with applied electromagnetic radiation to vary impedance to a RF signal transmitted in the waveguide assembly, for purposes such as switching, attenuating, routing, filtering, and transforming the RF signal.

BACKGROUND

Radio frequency (RF) switches are fundamental components of modern transceiver systems, enabling a variety of functionality including signal routing, redundancy switching, band selection, and phase shifting. In particular, waveguide switches are typically chosen for millimeter-wave (mm-wave) to sub-mm-wave applications due to their low insertion loss and high power handling [Reference no. 1].

A number of technologies for the waveguide switching element have been developed, including electromechanical rotors and p-i-n diode switches [Reference nos. 2, and 19], and RF MEMS and microfluidic-based switches as reported in the literature [References nos. 3-5 and 20-21]. However, most of these approaches use traditional metal-machined waveguides, and thus are large, heavy, and difficult to integrate with planar microwave technology and on chip.

Silicon (Si) micromachining technology offers benefits including high precision with micrometer tolerances, high performance up to sub-mm-wave bands and beyond, and integration with planar technology [Reference nos. 10 and 22].

While an integrated waveguide switch using RF MEMS was proposed [see Reference no. 4], self-actuation, reliability, and stiction issues limit its use for high power applications. The optical control of microwave and mm-wave signals by photogeneration of solid state plasmas within semiconductors has shown promise as high performance switching and phase shifting technology [References nos. 6-7]. Not only is the bias network of the optical source isolated from the RF signal, the plasma element itself offers advantages including high power handling and linearity [Reference no. 23], fast switching times [Reference no. 24], and low insertion loss [Reference no. 25]. Applications in the literature include switches, variable attenuators, and tunable phase shifters [References nos. 7-9].

The prior art discloses waveguide devices and associated switches.

U.S. Pat. No. 4,507,632A (Baril et al.; Mar. 26, 1985) discloses an electromagnetic wave switch formed by a rectangular wave-guide whose dimensions allow the propagation of millimeter waves comprising a step providing a so-called ridged space, of given volume, in which is disposed a bar of semiconductor material with high breakdown voltage and low thermal resistance, whose volume is identical to that of the ridged space.

U.S. Pat. No. 5,099,214A (Rosen et al.; Mar. 24, 1992) discloses a waveguide having walls defining an opening. An optically transmissive aperture in one wall allows light from an optical illumination source such as a laser diode array to illuminate the opening in which is located a semiconductor slab positioned to be illuminated. When the array illuminates the slab, the propagation characteristics (phase velocity and attenuation constant) of the waveguide changes. A continuous wave signal passing through the waveguide is thus attenuated and phase shifted.

U.S. Pat. No. 5,317,293A (Bacon et al.; May 31, 1994) discloses an RF switch circuit including a waveguide transmission line having a wall having a cavity disposed therein and aligned along a centerline of the waveguide transmission line and means for providing a substantially short circuit impedance characteristic between the cavity and the waveguide transmission line to RF signals propagating along the waveguide transmission line.

U.S. Pat. No. 5,847,672A (James; Dec. 8, 1998) discloses a microwave device incorporating a photosensitive baffle that is selectively illuminated changing the baffle's electronic characteristic from being transparent to being reflective of microwave energy. The baffle serves as a gate, tuning element, reflector and the like.

U.S. patent application publication no. 20170012335A1 (Boutayeb; Jan. 12, 2017) discloses a substrate integrated waveguide switch and a method of operating the substrate integrated waveguide switch. A system includes a dielectric substrate and a switch supported by the dielectric substrate, the switch comprising at least one first transmission path, at least one first switching element in each of the at least one first transmission path, a second transmission path, and at least one second switching element in the second transmission path.

There remains a need in the art for a switch for RF signals at mm-wave frequencies inside a micro-machined waveguide channel, for methods of fabricating such a switch, and for methods of switching RF signals in semiconductor devices.

SUMMARY

In one aspect, the present invention comprises a system for impeding a radio frequency (RF) signal, the system comprising a waveguide assembly integrated with a semiconductor wafer. The system comprises: (a) a waveguide channel defined by internal walls of the wafer lined with a metallic layer, comprising at least one port for transmission of the RF signal into or out of the waveguide channel; and (b) at least one semiconductor obstacle member disposed in the waveguide channel, wherein the semiconductor obstacle member is responsive to applied electromagnetic radiation to vary electrical conductance of the obstacle member, and thereby vary the electrical impedance of the obstacle member to transmission of the RF signal through the waveguide channel.

In embodiments of the system, the waveguide channel has a substantially rectangular prismatic shape or a substantially cylindrical shape.

In embodiments of the system, the waveguide channel comprises a first waveguide channel section, and a second waveguide channel section, wherein a channel height of the first waveguide channel section is greater than a channel height of the second waveguide channel section, such that an electrical impedance of the first waveguide channel section is greater than an electrical impedance of the second waveguide channel port section ion.

In embodiments of the system, the waveguide channel comprises a third waveguide channel section, a fourth waveguide channel section, and a fifth waveguide channel section, wherein the third waveguide channel section is disposed between the fourth and fifth waveguide channel sections, wherein a channel transverse width of the third waveguide channel section is less than a channel transverse width of the fourth and fifth waveguide channel sections, and wherein the at least one obstacle member is disposed in the third waveguide channel section.

In embodiments of the system, the at least one output port of the waveguide channels consists of a single port.

In embodiments of the system: the at least one port of the waveguide channel comprises an input port, a first output port and a second output port disposed apart from the first output port; the waveguide channel defines a first path from the input port to the first output port; the waveguide channel defines a second path from the input port to the second output port, and separate from the first path; and the at least one obstacle member comprises a first obstacle member disposed in the first path, and a second obstacle member disposed in the second path. The waveguide assembly may further comprises a tuning stub disposed between the first path and the second path.

In embodiments of the system: the at least one port of the waveguide channel comprises an input port and an output port; the waveguide channel defines a primary path from the input port to the output port, and a short-circuited stub path extending from the primary path; and the at least one obstacle member is disposed in the stub path. The at least one obstacle member may comprise a plurality of obstacle members disposed in the stub path. The plurality of obstacle members may be arranged in a row aligned along a length of the stub path.

In embodiments of the system, the metallic layer comprises gold, nickel, aluminum, chromium, tungsten, platinum, or silver.

In embodiments of the system, the obstacle member comprises silicon, germanium, gallium arsenide, gallium nitride, silicon germanium, silicon carbide, indium phosphide, or gallium phosphide.

In embodiments of the system, the internal walls defining the waveguide channel and the obstacle member comprise the same semiconductor material, or different semiconductor materials.

In embodiments of the system, the obstacle member extends from the metallic layer lining the internal wall of the wafer to the window.

In embodiments of the system, the obstacle member is in the form of a post extending in a traverse direction perpendicular to a planar direction defined by the wafer.

The post may have a substantially circular cross-sectional shape.

In embodiments of the system, the at least one obstacle member comprises a plurality of obstacle members arranged in a row or an array.

In embodiments of the system, the waveguide assembly further comprises a window comprising an electromagnetic radiation (ER) transparent semiconductor layer terminating the obstacle member to allow for excitation of the obstacle member by applied electromagnetic radiation emitted by a source external to the wafer. The ER transparent semiconductor layer may comprise silicon nitride, silicon dioxide, indium tin oxide, or a transparent metal mesh film incorporated in a semiconductor support. The window may have a dimension less than $1/12^{th}$ of the wavelength (2) of the RF signal being transmitted through the waveguide. In embodiments of use, the RF signal has a frequency of from about 1 GHz to 300 GHz, or a wavelength of from about 1 mm to about 300 mm. Therefore in embodiments, the dimension (e.g., diameter) of the window may be from about 0.083 mm to about 25 mm, and more particularly about 0.45 mm or less. The window may be recessed from a surrounding outer surface of the wafer.

In embodiments of the system, the system further comprises an electromagnetic radiation (ER) emitter for emitting the applied electromagnetic radiation. The ER emitter may comprise a light emitting diode (LED), a laser diode, or a vertical cavity surface emitting laser (VCSEL). The ER emitter may be configured to emit electromagnetic radiation in the UV spectrum, the visible light spectrum, or the infrared spectrum. The system may further comprise an optical fiber for optically coupling electromagnetic radiation emitted by the ER emitter to the obstacle member. The system may further comprise a control means comprising a microcontroller, a switch, or a variable resistor operatively connected to the electromagnetic radiation ER emitter and configured for selectively controlling one or both of a frequency or a power level of electromagnetic radiation emitted by the ER emitter.

In embodiments of the system, the waveguide channel may be void of semiconductor material or comprise semiconductor material, other than semiconductor material of the obstacle member, between the metallic layer lining the internal walls that define the waveguide channel.

In another aspect, the present invention comprises a method of varying impedance to transmission of a radio frequency (RF) signal through a waveguide channel defined internally in a semiconductor wafer, the method comprising the steps of: (a) providing at least one semiconductor obstacle member disposed in the waveguide channel; and (b) selectively varying either one or both of frequency or power level of electromagnetic radiation applied by to the at least one obstacle member to vary electrical conductance of the obstacle member, and thereby vary impedance of the at least one obstacle member to transmission of the RF signal through the waveguide channel.

In embodiments of the method, the RF signal has a frequency in a range of about 1 GHz to about 300 GHz, and more particularly, the RF signal may be in the $K_a$-band having a frequency in a range of about 26.5 GHz to about 40 GHz.

In embodiments of the method, varying either one or both of energy level or power level of electromagnetic radiation applied by the ER emitter to the at least one obstacle member results in an insertion loss of at least 20 dB between the input port and the output port.

In embodiments of the method, selectively varying power level of electromagnetic radiation applied by the ER emitter comprises varying the intensity of electromagnetic radiation emitted between a null power level and a non-null power level.

In embodiments of the method, selectively varying power level of electromagnetic radiation applied by the ER emitter comprises varying the power level of electromagnetic radiation emitted between a first non-null power level and a second non-null power level different from the first non-null power level.

In embodiments of the method: the at least one obstacle member comprises a first obstacle member and a second obstacle member; and selectively varying either one or both of frequency or power level of electromagnetic radiation applied by the ER emitter to the at least one obstacle member comprises selectively varying either one or both of frequency or power level of electromagnetic radiation applied to the first obstacle member independently of selectively varying either one or both of electromagnetic radiation applied to the second obstacle member.

In embodiments of the method, the electromagnetic radiation applied by the ER emitter is in the UV spectrum, the visible light spectrum, or the infrared spectrum.

In another aspect, the present invention comprises a method of fabricating a waveguide assembly for impeding a radio frequency (RF) signal, the waveguide assembly integrated with a semiconductor wafer, the method comprising the steps of: (a) providing a first portion of the wafer and a separate second portion of the wafer; (b) etching an inner surface of the first portion of the wafer to define: (i) walls of a waveguide channel comprising at least one port for transmission of the RF signal into or out of the waveguide channel; and (ii) a semiconductor obstacle member disposed in the waveguide channel; (c) depositing a first metallic layer on the inner surface of the first portion of the wafer to line the walls of the waveguide channel; (d) if necessary, etching the deposited first metallic layer to expose the obstacle member to the waveguide channel; (e) if necessary, depositing a second metallic layer on an inner surface of the second portion of the wafer to provide a metalized inner surface of the second portion of the wafer; and (f) bonding the first metallic layer deposited on the inner surface of the first portion of the wafer to the metalized inner surface of the second portion of the wafer.

BRIEF DESCRIPTION OF THE DRAWINGS

In the drawings, like elements may be assigned like reference numerals. The drawings are not necessarily to scale, with the emphasis instead placed upon the principles of the present invention. Additionally, each of the embodiments depicted are but one of a number of possible arrangements utilizing the fundamental concepts of the present invention.

DETAILED DESCRIPTION

Definitions

Aspects of the invention relate to a waveguide assembly in a semiconductor wafer, its fabrication using microfabrication processes, and methods of controlling the waveguide assembly with applied electromagnetic radiation to vary impedance to a radiofrequency (RF) signal transmitted in the waveguide assembly, for purposes such as switching, routing, filtering, and transforming the RF signal. Any term or expression not expressly defined herein shall have its commonly accepted definition understood by a person skilled in the art.

Waveguide Assembly.

Figure 1A:
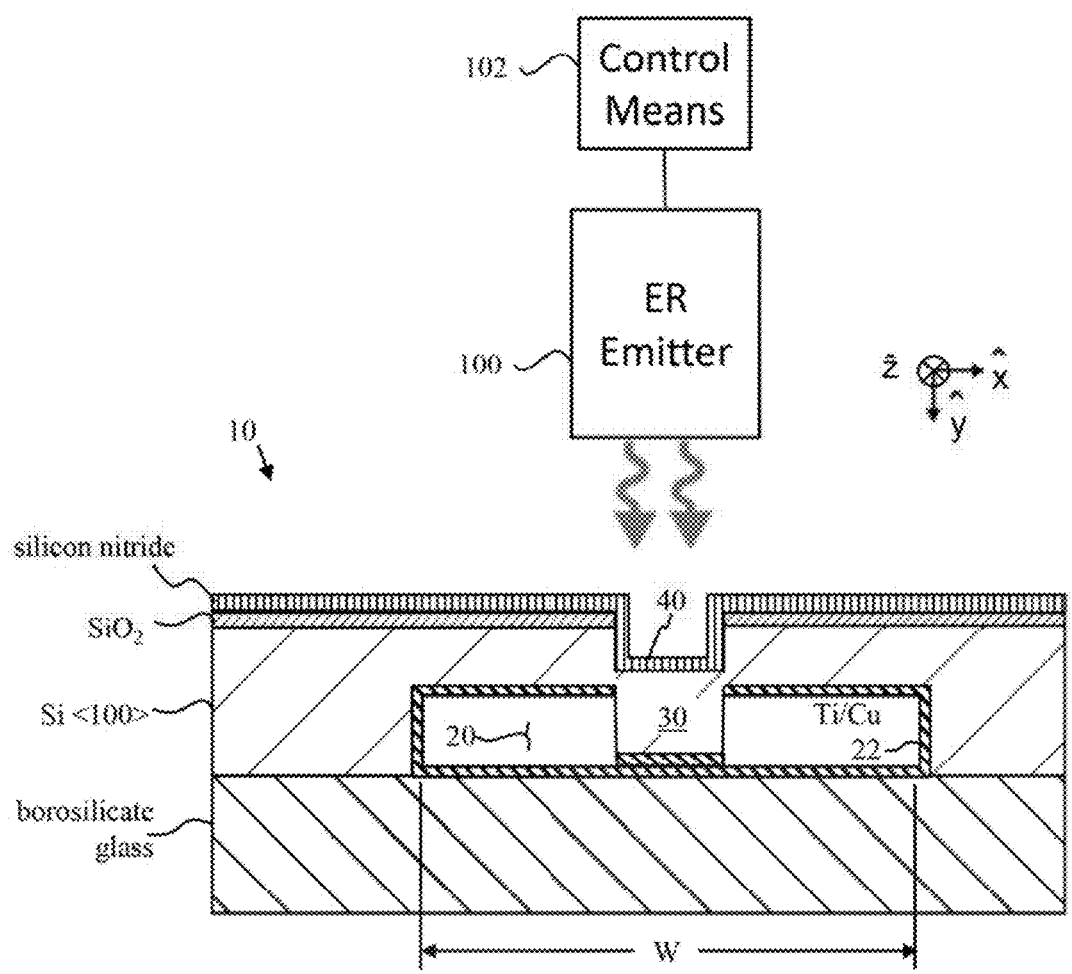
FIG. 1A shows a schematic cross-sectional view through the thickness of a semiconductor wafer that includes an embodiment of a waveguide assembly of the present invention including an obstacle member in the form of a Si post, and with an electromagnetic radiation (ER) emitter.
Figure 1B:
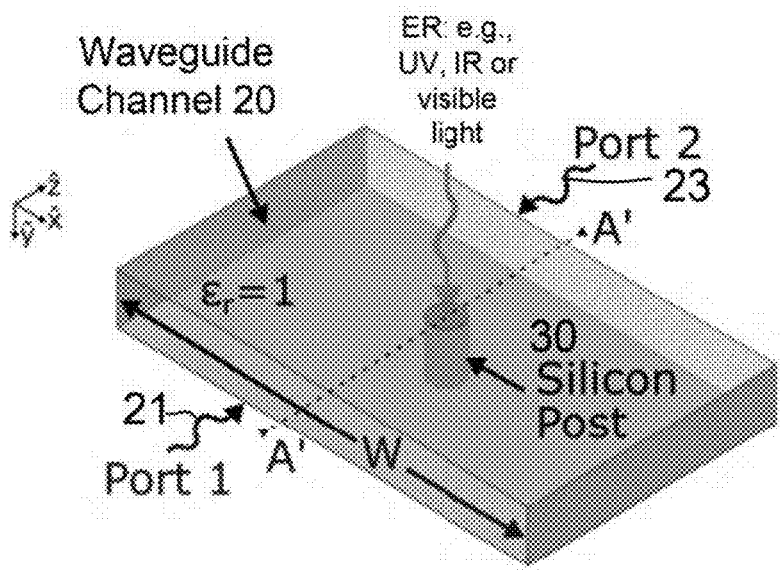
FIG. 1B shows a schematic isometric view of waveguide channel and obstacle member of FIG. 1A.
Figure 1C:
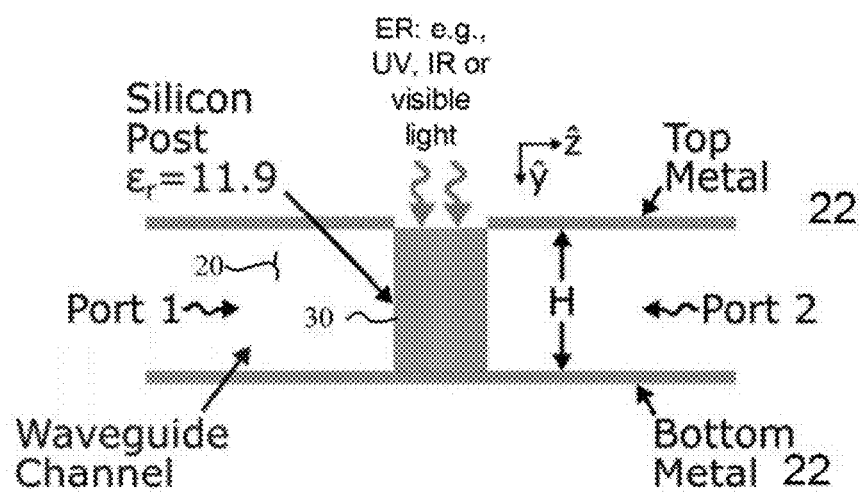
FIG. 1C shows a cross-sectional view of the waveguide channel and obstacle member of FIG. 1A along line A'-A' of FIG. 1B.

FIG. 1A shows a schematic cross-sectional view through the thickness of a semiconductor wafer (10) that includes an embodiment of a waveguide assembly of the present invention. In FIGS. 1A-1C, a set of mutually orthogonal axes (X-Y-Z) are provided for spatial reference. The waveguide assembly integrated with wafer (10) includes waveguide channel (20), semiconductor obstacle member (30), and window (40). The wafer (10) and an electromagnetic radiation (ER) emitter (100) form a system of the present invention.

Semiconductor Wafer.

Wafer (10) is made of a semiconductor material. In the embodiment shown in FIG. 1A, the wafer (10) comprises four semiconductor layers, from top to bottom: silicon nitride, silicon oxide ($SiO_2$); substantially pure silicon (Si<100>), which may or may not include dopants; and borosilicate glass. In other embodiments, wafer (10) may include different semiconductor material(s), which may be arranged in a single layer or different layers.

Waveguide Channel.

Waveguide channel (20) is an internal portion of wafer (10) that allows for transmission of an RF signal, which portion is defined by the internal walls of wafer (10) lined with a metallic layer (22).

In the embodiment shown in FIGS. 1A to 1C, the waveguide channel (20) is a cavity that is void of semiconductor material, and filled with air between the metallic layers (22). In other embodiments, however, the waveguide channel (20) may comprise semiconductor material between the metallic layers (22). In one embodiment, the semiconductor material between the metallic layers (22) may be the same as the semiconductor material that forms the obstacle member (30), but not completely fill the space between the metallic layers (22) such that the obstacle member (30) is a structurally distinct feature disposed in the space between the metallic layers (22). In such embodiments, the waveguide channel (20) and the obstacle member (30) may be formed by bulk micromachining. In another embodiment, such as in a substrate integrated waveguide channel (20), the semiconductor material that forms the waveguide channel (20) between the metallic layers (22) may be different in composition than the semiconductor material that forms the obstacle member (30). In such embodiments, the obstacle member (30) may be inserted, grown, or deposited in the waveguide channel (20) after fabrication of the waveguide channel (20). Thus, when not optically stimulated, the dielectric constant of the semiconductor material that forms the obstacle member (30) may be either matched or non-matched to the dielectric constant of the semiconductor material that forms the waveguide channel (20), as may be required by a particular application.

In this embodiment, the metallic layer (22) is a mixture of the titanium and copper (Ti/Cu). In other embodiments, other metallic materials may be used, with non-limiting examples including gold, nickel, aluminum, chromium, tungsten, platinum, and silver, among others, and mixtures of them.

Waveguide channel (20) has at least one port for transmission of the RF signal into or out of the waveguide channel (20). In some embodiments, the waveguide channel (20) has at least two ports, so as to extend from an input port to an output port for transmission of the RF signal. In FIG. 1A, for example, the waveguide channel (20) extends longitudinally in the direction perpendicular to the drawing plane, such that input port and output ports (such as labelled as Port 1 and Port 2 in FIGS. 1B and 1C), are spaced apart in the direction perpendicular to the drawing plane. In use, transmission of a RF signal from the input port to the output port is guided along waveguide channel (20) due to impedance of metallic walls (22). In FIG. 1B, the RF signal (21) is shown as entering the waveguide channel (20) from both a port (labelled Port 1), while another RF signal (23) is shown as entering another (labelled Port 2). It will be understood with respect to the RF signal (21), Port 1 is considered to be an input port, while Port 2 is considered to be an output port; with respect to RF signal (23), Port 2 is considered to be an input port, while Port 1 is considered to be an output port.

In other embodiments, the waveguide channel (20) may have only one port that serves as both an input port through which an RF signal enters the waveguide channel (20), and an output port through which the RF signal exits the waveguide channel (20). A non-limiting example of such a single-port waveguide channel (20) is shown in the cavity resonators in FIGS. 13A, 13B, and 14. Another example of such a single-port waveguide channel is a reflection-based phase shifter embodiment (see Example 9 described below), which may be implemented with a single port waveguide channel (20) in alternative embodiments (not shown). In still other embodiments, the at least one port may comprise more than two ports, such as the three-port waveguide channel (20) shown in FIG. 10.

In the embodiment of FIGS. 1A and 1B, the cavity of waveguide channel (20) has a rectangular prismatic form. In one embodiment, the transverse width (W) of the waveguide channel (20) is chosen as per the desired operating bandwidth for a particular application, i.e., the $TE_{1,0}$ monomode bandwidth. (In FIGS. 1A and 1B, it will be noted that the transverse width is the dimension in the direction that is parallel to the plane of the wafer (10), and perpendicular to the direction of transmission of RF signals (21, 23) between the ports of the waveguide channel.) In other embodiments, the cavity of waveguide channel (20) may have other forms and dimensions.

Semiconductor Obstacle Member.

Semiconductor obstacle member (30) is integral with the wafer (10). Obstacle member (30) is disposed in the waveguide channel (20) (e.g., between the input port and the output port of waveguide channel (20)), thus posing an obstacle to the transmission of the RF signal from the input port to the output port of waveguide channel (20).

In the embodiment of FIG. 1A, obstacle member (30) is substantially pure silicon (denoted Si<100>), selected for its high-resistivity and long carrier lifetime. In other embodiments, obstacle member (30) may comprise another semiconductor material.

As will be appreciated by persons skilled in the art, electrical conductance of a semiconductor material increases with the energy level of electromagnetic radiation (ER)—i.e. the frequency of the photons—applied to the semiconductor material. The energy level of the applied electromagnetic radiation must be greater than the semiconductor bandgap energy level in order to generate electron-hole pairs, to increase the electrical conductance of the semiconductor material. As will be further appreciated by persons skilled in the art, the semiconductor material also increases in electrical conductance in response to an increase in intensity—i.e., power level—of electromagnetic radiation (provided the electromagnetic radiation frequency has an energy level above the semiconductor bandgap energy) applied to the semiconductor material because the increased power level increases the number of electron-hole pairs generated for a given energy level of the applied ER. Non-limiting examples of semiconductor materials suitable for forming the obstacle member (30) and their bandgap energies and corresponding wavelengths in parentheses include the following: silicon, Si (1.12 eV=1107 nm); germanium, Ge (0.661 eV=1876 nm); gallium arsenide, GaAs (1.424 eV=870.7 nm); gallium nitride, GaN (3.28 eV=378 nm); silicon germanium, SeGe (0.66 to 1.86 eV=665.6 to 1879 nm); silicon carbide, SiC (2.36 to 6 eV=206.6 to 525.4 nm); indium phosphide, InP (1.344 eV=922.5 nm); gallium phosphide, GaP (2.26 eV=548.6 nm); and other silicon-based semiconductor materials. Others could be chosen, each with their own particular set of attributes. For example, the person skilled in the art will appreciate that the electrical conductance of silicon may be increased by application of ER in the visible light spectrum (wavelengths from about 400 to about 700 nm), as well as in the infrared spectrum (wavelengths from about 700 nm to about 1 mm). In contrast, gallium nitride has bandgap energies in the UV spectrum (wavelengths from about 10 nm to about 400 nm), and its electrical conductance can be increased by application of ER in the UV spectrum.

In the embodiment of FIG. 1A, obstacle member (30) is in the form of substantially cylindrical post that extends transversely (i.e., perpendicularly) to a planar direction defined by wafer (10). In the embodiment of FIG. 1A, obstacle member (30) extends from metallic layer (22) lining the internal wall of the wafer (10) to window (40). In other embodiments, obstacle member (30) may have a different form, so long as the obstacle member (30) presents an obstruction with the waveguide channel (20).

In the embodiment of FIGS. 1A and 1B, obstacle member (30) is disposed in about the center of waveguide (20) in the transverse direction of its width (W) (i.e., the direction perpendicular to the direction of transmission of the RF signal from the input port to the output port), where the peak electric field of the $TE_{1,0}$ mode is located, for maximum effect on OFF-state isolation, when the obstacle member (30) is used as a switch, as described below. In other embodiments, obstacle member (30) may have a different position within waveguide channel (20). For example, obstacle member (30) can also be offset from the transverse center of the waveguide channel (20), in such a way as to optimize the amount of OFF-state isolation and ON-state insertion loss for a particular design application.

The obstacle member (30) can be constructed monolithically within the same material as the waveguide channel (20), thus being fully integrated, or in separate materials and assembled into the waveguide channel (20) at a later time.

Obstacle member (30) may be customized in respect to its position, size, and shape within the waveguide channel (20) for different design purposes, such as to improve impedance matching, to match to the shape of the optical source to improve efficiency, or to account for skin depth.

Window.

Window (40) is disposed at an outer surface of wafer (10) and terminates the obstacle member (30). In FIG. 1A, wafer (10) is shown as being isolated. In other embodiments, wafer (10) may be integrated with an additional upper wafer (not shown) attached to the uppermost surface of wafer (10), or an additional lower wafer (not shown) attached to the lowermost surface of wafer (10), such as to form a stack of wafers for an integrated circuit (IC) chip. In such embodiments, the uppermost or lowermost surface of wafer (10) may still be considered as an "outer surface" of wafer (10), despite not forming a terminal layer of the stack of wafers.

Window (40) comprises an electromagnetic radiation (ER) transparent semiconductor layer terminating the obstacle member (30), to allow for application of electromagnetic radiation to the obstacle member (30) by an ER emitter (100) external to the wafer. Accordingly, "electromagnetic radiation transparent" or "ER transparent", as used herein refers to a semiconductor material that allows for transmission of electromagnetic radiation through the semiconductor material, where the electromagnetic radiation is in any one of the UV spectrum, the visible spectrum, or the infrared spectrum—i.e., the portion of the electromagnetic spectrum having wavelengths from about 10 nm to about 1 mm. In embodiments, the ER transparent semiconductor material may be optically transparent. "Optically transparent", as used herein, refers to a semiconductor material that allows for transmission of electromagnetic radiation in the visible spectrum—i.e., the portion of the electromagnetic spectrum having wavelengths from about 400 to about 700 nm—through the semiconductor material. In the embodiment of FIG. 1A, the optically transparent semiconductor material of window (40) is silicon nitride, which may be advantageous because of its anti-reflective (AR) properties. In other embodiments, the optically transparent semiconductor material of window (40) may be another material, with non-limiting embodiments including indium tin oxide (ITO), or an optically transparent metal mesh film incorporated in a semiconductor support, to not only provide an AR property at optical frequencies, but to also provide a conductive property for RF signals. In still another embodiment, the ER transparent semiconductor of window (40) may comprise a layer of grown or deposited silicon dioxide, which would also have AR properties.

If the area of the window (40) is small enough, having a dimension (e.g., a diameter) generally less than $1/12^{th}$ of the wavelength ($\lambda$) of the RF signal transmitted through the waveguide ($<\lambda/12$), then the window (40) is expected to have negligible effect on the performance of the waveguide assembly. In embodiments of use, the RF signal has a frequency of from about 1 GHz to 300 GHz, or a wavelength of from about 1 mm to about 300 mm. Therefore, in embodiments, the dimension (e.g., diameter) of the window may be from about 0.083 mm to about 25 mm, and more particularly about 0.45 mm or less. It will be appreciated, however, that these wavelengths assume that the RF signal is travelling through air, as the dielectric, in the waveguide. If instead, the RF signal is transmitting through a higher permittivity semiconductor material of the waveguide, then the wavelength will be decreased by a factor of the inverse of the square root of the permittivity, and this will have accordingly affect the suitable dimension of the window (40).

In the embodiment of FIG. 1A, window (40) is recessed from the remainder of the outer surface of wafer (10). The recess effectively creates a receptacle (18) or hole to receive a fiber optic cable (16) (such as shown in FIG. 5D) that optically couples electromagnetic radiation emitted by ER emitter (100) to window (40).

Electromagnetic Radiation (ER) Emitter.

Electromagnetic radiation (ER) emitter (100) is any device that emits electromagnetic radiation with energy greater than the bandgap of the semiconductor material of the obstacle member (30) to be excited. The particular wavelength of the emitted ER to be selected will depend on the particular semiconductor material selected for forming the obstacle member (30). For example, where the semiconductor material of obstacle member is silicon (bandgap wavelength of about 1100 nm), the ER emitter may be a laser that emits ER radiation with a wavelength of about 915 nm in the infrared spectrum. In embodiments, the ER emitter emits electromagnetic radiation in the UV spectrum (wavelengths from about 10 nm to about 400 nm), in the visible spectrum (wavelengths from about 400 to about 700 nm), or in the infrared spectrum (wavelengths from about 700 nm to about 1 mm). Non-limiting examples of ER emitter (100) include a light emitting diode (LED), a laser diode which may emit ER in the visible spectrum or the infrared spectrum, or a vertical cavity surface emitting laser (VCSEL).

In embodiments, such as where ER emitter (100) is an LED, the LED may be integral with wafer (10) by fabrication using microfabrication processes for semiconductor devices. In other embodiments, ER emitter (100) may be formed separately and attached to wafer (10). In still other embodiments, ER emitter (100) may be physically separate from wafer (10), but optically coupled to window (40) such as by a fiber optic cable (16) (see FIG. 5D).

In embodiments, ER emitter (100) is operatively connected to a control means (102) for selectively controlling one or both of the energy level or power of electromagnetic radiation energy applied by ER emitter (100) to obstacle member (30), which in turn allows for selective control of the impedance effect of obstacle member (30) on transmission of a RF signal through waveguide channel (30), as described below. Suitable control means (102) are known to persons skilled in the art, with non-limiting examples including microcontrollers, variable resistors for controlling power supplied to ER emitter (100), switches for selectively controlling one of a plurality of ER emitting elements of ER emitter (100), color variable LEDs, and tunable lasers having wavelengths that can be altered in a controlled manner, among others. In embodiments where the waveguide assembly includes a plurality of obstacle members (30), the control means may be configured for selectively varying the energy level (i.e., frequency) and/or intensity (i.e., power level) of electromagnetic radiation applied to one of the obstacle members (30), independently of the frequency and/or power level of electromagnetic radiation applied to another one of the obstacle members (30). For example, each obstacle member (30) may be associated with a different one of a plurality of ER emitters (100), which can be controlled in respect to energy level and/or power independently of the other ER emitters (100). Furthermore, the control means can control ER emitter (100) to be pulsed (e.g., intermittently emitting electromagnetic radiation) to improve thermal management of the wafer (10), as well as the ER emitter (100).

Use and Principle of Operation of Obstacle Member.

In general, the energy level and/or power level of electromagnetic radiation applied by the ER emitter (100) to obstacle member (30) may be selectively varied by the control means (102) to control the electromagnetic excitation of the obstacle member (30) with a view to varying the electrical conductance of the obstacle member (30), and hence the impedance of the obstacle member (30) to transmission of the RF signal in the waveguide channel (20). This may be performed for exemplary uses of the waveguide assembly, such as switching, attenuating, routing, filtering, and transforming the RF signal in the waveguide channel (30). The present invention is not limited by the frequency of the RF signal. In non-limiting embodiments, the RF signal may be in the millimeter-wave bands (about 1 GHz to about 300 GHz), and more particularly in the $K_a$-band (about 26.5 GHz to about 40 GHz).

FIGS. 1B and 1C show the waveguide (20) and obstacle member (30) (Si post) of the waveguide assembly of FIG. 1A. Other parts of wafer (10) shown in FIG. 1A are omitted for purposes of explaining the principle of operation of the waveguide assembly.

The attenuating effect of obstacle member (30) on transmission of a RF signal through the waveguide channel (20) can be controlled by the energy level (frequency) and/or power level of electromagnetic radiation energy applied by electromagnetic radiation source (100) to obstacle member (30). In the following discussion, the case of ER emitter (100) being "off" (e.g., not emitting electromagnetic radiation) and "on" (i.e., emitting electromagnetic radiation) is used to describe the effect for illustrative purposes. Intermediate effects may be produced by varying the intensity (power level) of electromagnetic radiation emitted from ER emitter (100) between different non-null energy levels and/or power. Thus, where the energy level and/or power of electromagnetic radiation emitted by ER emitter (100) can be selectively controlled using control means (102), the attenuating effect of obstacle member (30) on transmission of a RF signal in waveguide channel (20) can be selectively tuned, possibly in a continuous manner.

When ER emitter (100) is "off", obstacle member (30) is in an insulating state relative to when ER emitter (100) is "on". Stated alternatively, when ER emitter (100) is "on", obstacle member (30) is in a conductive state relative to when ER emitter (100) is "off". When obstacle member (30) is in the insulating state, obstacle member (30) allows microwave and millimeter-wave RF signals to pass from the input port to the output port of waveguide channel (20) with low insertion loss. Thus, the obstacle member (30) may be considered to be in the "ON-State". Conversely, when obstacle member (30) is in the conductive state, obstacle member (30) behaves like a short circuit shunt within waveguide channel (20) to reflect incoming microwave and millimeter-wave RF signals, and thus provide relatively higher isolation of transmission of the RF signals from the input port to the output port of waveguide channel (20). Thus, the obstacle member (30) may be considered to be in the "OFF-State".

To elaborate, as shown in FIG. 1C, photons emitted from ER emitter (100) that have passed through window (40) are incident upon obstacle member (30) and absorbed the obstacle member (30). If the energy of the photons is sufficient (e.g., with energy $h\nu > E_g \approx 1.12$ eV, the bandgap of Si), then this will generate free carriers within obstacle member (30). The obstacle member (30) is thereby changed from a capacitive to a conductive load, allowing for the transmission or reflection of mm-waves within waveguide channel (20).

To relate the incident optical power at the top of the obstacle member (30) to the photogenerated free carrier concentration and thus the bulk DC conductivity within the obstacle member (30), the equations of continuity and charge neutrality for the generation and recombination of electrons and holes in a semiconductor are used [Reference no. 11]. At steady-state, with a constant spatial distribution of free carriers, the continuity equation can be expressed as $$D_{eff}\nabla^2 n - \frac{n}{\tau_{eff}} + g = 0 \quad (1)$$

where n is the total number of free carriers, $D_{eff}$ the effective diffusion coefficient, $\tau_{eff}$ the effective carrier lifetime, and g the generation rate [Reference no. 12]. As shown in FIG. 1C, making the assumption of a 1-dimensional case with optical excitation normal to the surface of obstacle member (30), and the generation rate decaying exponentially into the Si of obstacle member (30) in the $\hat{y}$ direction, g can be expressed as $$g(y) = \alpha P_{opt}(1-R)\lambda_{opt}e^{-\alpha y}/hc \quad (2)$$

where α is the absorption coefficient and R the reflectivity of the Si at optical excitation wavelength $\lambda_{opt}$, $P_{opt}$ is the optical power density at $\lambda_{opt}$, h is Planck's constant, and c the free-space speed of light [Reference no. 12]. Solving for the total carrier concentration n as a function of $P_{opt}$, the generated bulk DC conductivity of the semiconductor can be calculated as $$\sigma_{DC} = q\mu_{eff}n \quad (3)$$

where $\mu_{eff}$ is the effective mobility of both electrons and holes, and q the elementary unit charge [Reference no. 11]. To decrease the lateral diffusion of free carriers, the obstacle member (30) may be etched with a diameter smaller than the diffusion length $L_D = \sqrt{D_{eff}\tau_{eff}}$. This helps confine the free carriers within the area of obstacle member (30), and justifies the 1D theoretical approach [Reference no. 12].

Figure 2A:
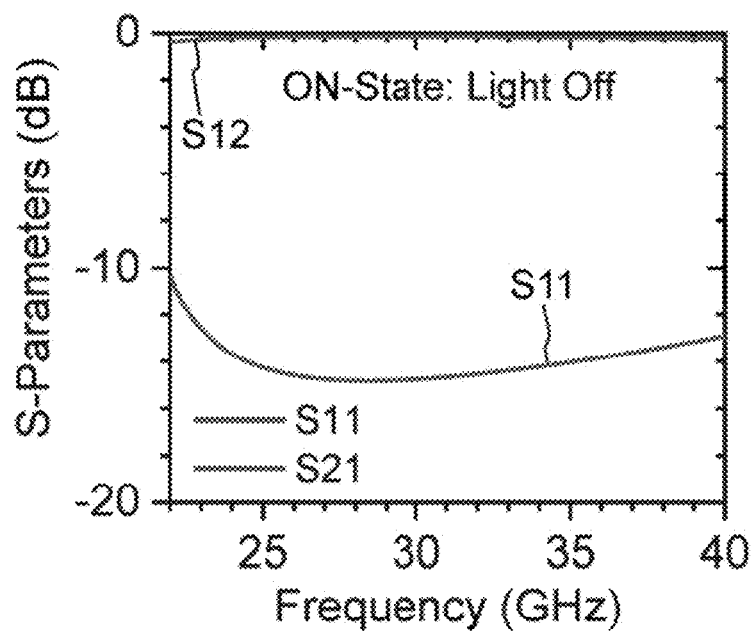
FIG. 2A is a chart showing results of HESS™ analysis of the obstacle member of FIG. 1A, when in the ON-state (i.e., no electromagnetic radiation is applied to the obstacle member).

The effect of increasing the conductivity of the obstacle member (30) (Si post) shown in FIGS. 1B and 1C is simulated in HFSS™ (a high-frequency structure simulator software, available from Ansys, Inc., Canonsburg, Pennsylvania, USA). In FIG. 2A, the ON-state scattering parameters with no optical excitation are shown—i.e., the semiconductor obstacle member (30) is in a dark state, with no light source shining or incident on the surface. The obstacle member (30) behaves as a shunt dielectric or capacitive load. Electromagnetic waves can pass through the waveguide channel (20).

Figure 2B:
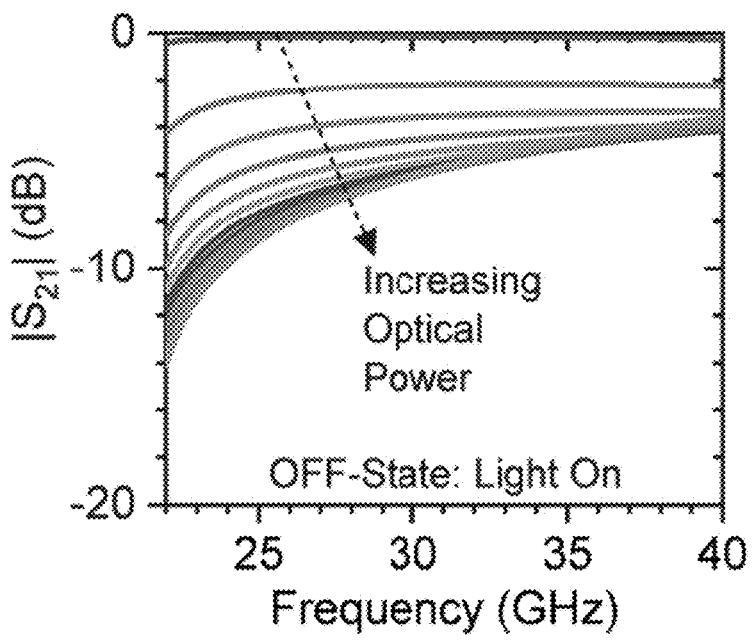
FIG. 2B is a chart showing results of HESS™ analysis of the obstacle member of FIG. 1B, when in the OFF-state (i.e., electromagnetic radiation is applied to the obstacle member), with increasing optical power of the applied electromagnetic radiation.

In the particular embodiment shown in FIG. 2B, with increasing optical power incident on the top of the obstacle member (30), the amount of OFF-state isolation increases, reaching a maximum at a conductivity between 350-400 S/m. Further increase in conductivity improves the total system loss. In other designs or embodiments, the amount of isolation achieved could be increased, decreased, or the same. When the semiconductor obstacle member (30) has electromagnetic radiation applied on it which is above the bandgap energy of the semiconductor material, the obstacle member (30) behaves as a conductor.

Thus, electromagnetic waves are mostly either absorbed or reflected by the obstacle member (30), depending upon the amount of applied optical energy, which relates to the realized value of conductivity within the obstacle member (30). By exciting the obstacle member (30) with electromagnetic radiation at the correct photon energy (specific to the choice of semiconductor), a solid state plasma can be formed, changing the electrical properties of the obstacle member (30) from dielectric to conductive, depending upon the amount of electromagnetic radiation energy applied. "Solid state plasma", as used herein, refers to a matter in the solid state, having mobile charged particles. With careful choice of placement and design of the obstacle member (30) or a plurality of obstacle members (30), the electric and magnetic fields inside the waveguide channel (20) can then be perturbed in a customized and highly flexible fashion, allowing for a wide variety of tunable and reconfigurable transfer functions in single, double, or multi-port configurations. The benefits of the microwave and millimeter-wave waveguide assembly using solid state plasma described herein include high power handling, high linearity, fast switching speed, low insertion loss, and a virtually unlimited lifetime, all within a highly integrated form factor which can be combined with other planar or nonplanar circuits and systems. Furthermore, the DC bias network of the electromagnetic radiation control system (i.e. ER emitter (100)) is isolated from the RF signal path, improving the performance and removing unwanted transients due to control voltage switching appearing in the input or output of the waveguide assembly.

OFF-state isolation by the obstacle member (30) can be improved in one or more of the following ways. First, the size of the obstacle member (30) may be increased, but at the expense of ON-state insertion loss due to the increased shunt capacitive loading. This increased shunt capacitive loading can be matched to with techniques including T-match and Π-match switch networks to significantly improve ON-state insertion loss. Second, the shape of the obstacle member (30) can be configured in a particular way to improve OFF-state isolation. Third, additional obstacle members (30) can be added to improve OFF-state isolation, keeping in mind the need to compensate for an increase in ON-state capacitive loading with the π-match region.

As noted, a T-match or Π-match circuit can be used to match the shunt capacitive loading of the semiconductor obstacle member (30) in the ON-state to improve the insertion loss and return loss across a reasonable bandwidth. Design details for T-match and Π-match circuits can be found in Reference no. 13, and examples of their application in the present invention are described in examples below.
Fabrication of Waveguide Assembly.

The waveguide assembly is fabricated using microfabrication processes for semiconductor devices. In one embodiment, the method for fabricating the waveguide assembly integrated with semiconductor wafer (10) includes the below steps. For illustrative purposes, reference is made to FIG. 4, which is further described in the example below.

Figure 4:
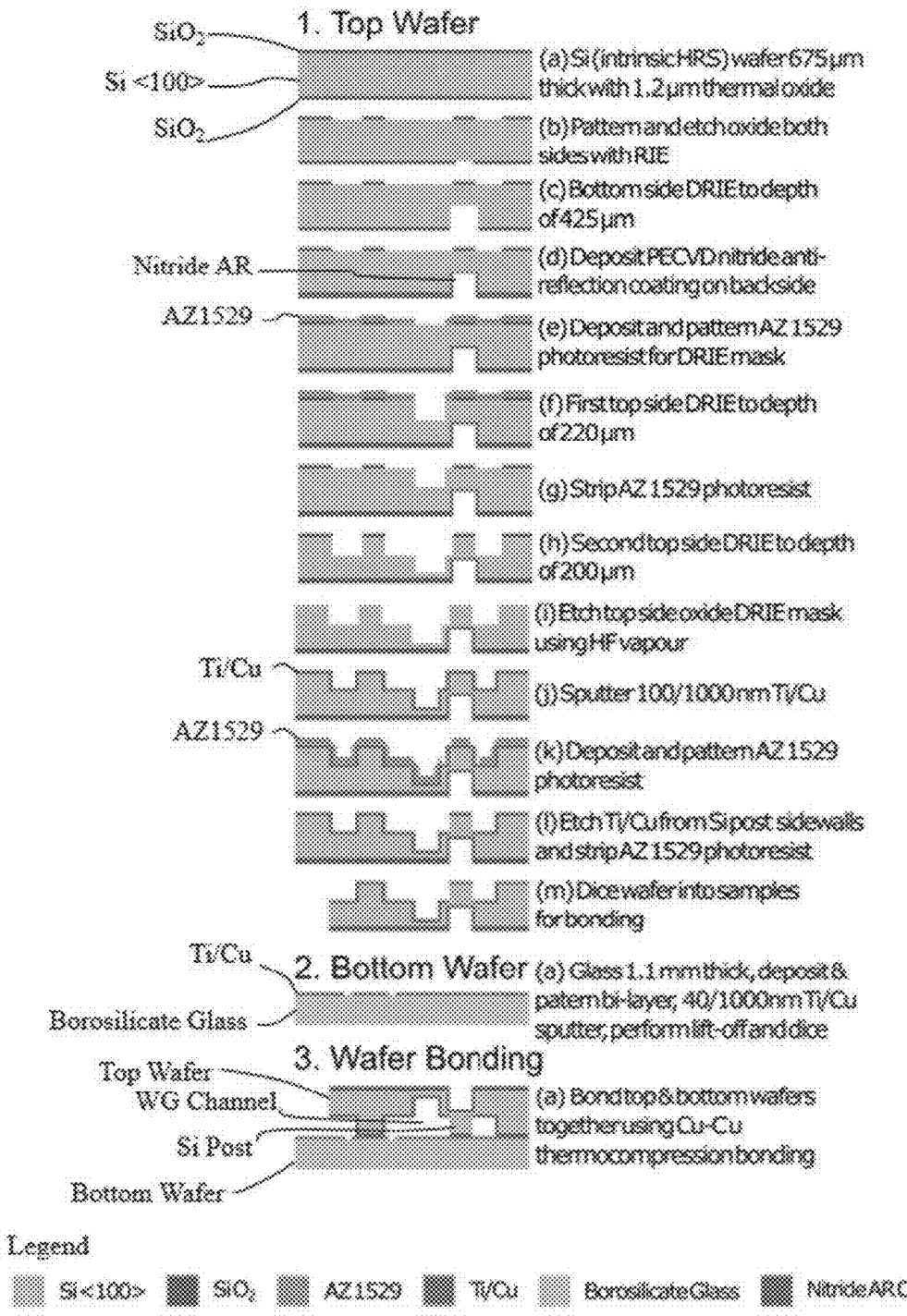
FIG. 4 shows a process flow for an embodiment of a method of the present invention for fabricating a waveguide assembly of the present invention.

First, the method involves providing a first portion of the wafer (10) and a separate second portion of the wafer (10). In the example of FIG. 4, the first portion of the wafer (10) is shown by top wafer, and the second portion of wafer (10) is shown by bottom wafer.

Next, the method involves etching an outer surface of the first portion of the wafer (10) to define a receptacle for the window (40). In the example of FIG. 4, this step is shown as (step c).

Next, the method involves depositing a layer of optically transparent semiconductor material for the window (40). In the example of FIG. 4, this step is shown as (step d).

Next, the method involves etching an inner surface of the first portion of the wafer (10). The etching is performed to define walls of a waveguide channel (20) extending from an input port to an output port for the RF signal. The etching is also performed to define the waveguide switch comprising the semiconductor obstacle member (30) extending from the window (40) comprising the optically transparent semiconductor layer at an outer surface of the first portion of the wafer (10), into the waveguide channel (20) between the input port and the output port of the waveguide channel (20). In the example of FIG. 4, this step is shown as (steps 1f, 1h, and 1i).

Next, the method involves depositing a first metallic layer on the inner surface of the first portion of the wafer (10) to line the walls of the waveguide channel (20). In the example of FIG. 4, this step is shown as (step 1j).

Next, the method involves etching the deposited first metallic layer to expose the obstacle member (30) to the waveguide channel (20). In the example of FIG. 4, this step is shown as (step 1l).

Next, the method involves depositing a second metallic layer on an inner surface of the second portion of the wafer (10) to provide a metalized inner surface of the second portion of the wafer (10). In the example of FIG. 4, this step is shown as (step 2a).

Finally, the method involves bonding the first metallic layer deposited on the inner surface of the first portion of the wafer (10) to the metalized inner surface of the second portion of the wafer (10). In the example of FIG. 4, this step is shown as (step 3).

EXAMPLES

The following examples illustrate specific aspects of exemplary embodiments of waveguide assembly, its fabrication, and its usage as a waveguide switch, a waveguide variable attenuator, an evanescent-mode bandpass filter waveguide switch, a tunable waveguide cavity resonator, an impedance matching network, and a distributed phase shifter. Further embodiments and uses are possible, without departing from the scope of the invention as claimed.

Example 1—Waveguide Assembly Layout

Figure 3A:
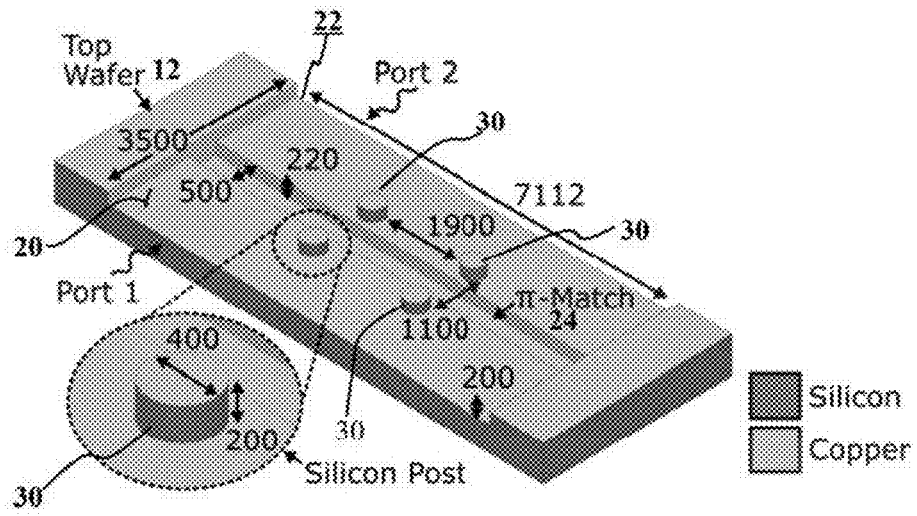
FIG. 3A shows the Π-design layout of an embodiment of the top wafer underside of a waveguide assembly of the present invention, including obstacle members in the form of Si posts, and π-match network. All dimension are shown in units of μm.
Figure 3B:
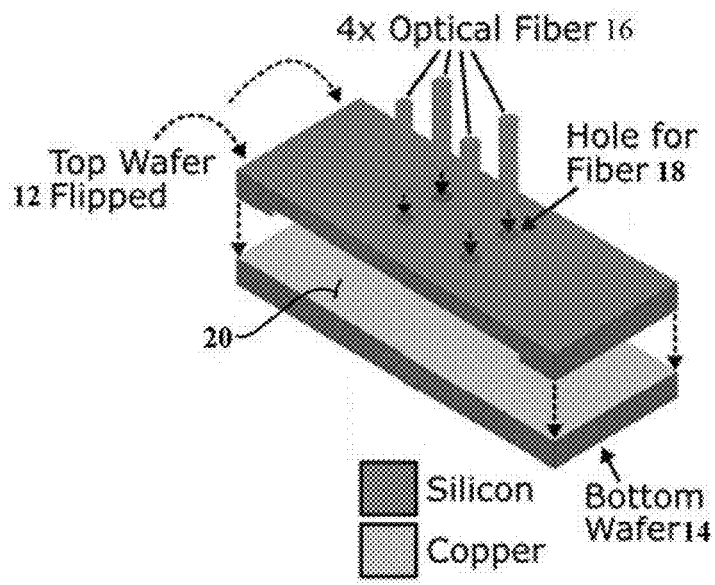
FIG. 3B shows the Π-design layout of an embodiment of the top wafer of FIG. 3A, when flipped for bonding onto an embodiment of the bottom wafer of a waveguide assembly of the present invention.

In FIGS. 3A and 3B, a layout for microfabrication of the waveguide assembly is shown. All dimension are shown in units of μm. The layout is chosen to operate within the Ka-band, with a total waveguide width of 7.112 mm (WR28). To achieve greater than 20 dB isolation, after a series of optimization studies in HESS, a two-by-two array of obstacle members (30) (Si posts), each with 400 μm diameters are placed within the waveguide channel (20) defined by metallic layer (22) comprising copper. In other embodiments, more or fewer obstacle members (30) could be added to the design to modify the performance of the waveguide assembly. In this embodiment, the circular cross-section of the obstacle member (30) is selected to match the circular cross-section of optical fibers (16) (see FIG. 5D) that are used to optically couple the ER emitter (100) to the window (40). This helps to ensure the maximum number of photons from the output of the optical fibers (16) are captured by the obstacle members (30). To ensure the obstacle members (30) (Si posts) become completely conductive with optical excitation, a height of 200 μm is chosen to be within the diffusion length $L_D$. This in turn determines the height of the waveguide channel (20) for this particular design. Furthermore, due to the capacitive loading effect of the obstacle members (30) (Si posts) in the ON-state, a π-switch configuration is chosen to improve matching [Reference no. 13].

A high impedance section between the rows of obstacle members (30) (Si posts) is formed by increasing the waveguide channel depth within this region by provision of a slot (24) (labelled π-Match) having a longitudinal length of 550 μm, and a depth of 220 μm.

As shown in FIG. 3B, the top portion (12) of wafer (10) is then flipped and bonded to the bottom portion (14) of wafer (10). Four optical fibers (16) inserted into receptacles (18) (holes) etched in the backside of the top wafer directly above the obstacle members (30) (Si posts) provide for optical coupling of an ER emitter (100) for excitation of the obstacle members (30).

Example 2—Process Flow for Fabrication of Waveguide Assembly

FIG. 4 shows the fabrication process of the waveguide assembly, according to the layout shown in FIGS. 3A and 3B. Si micromachining using deep reactive-ion etching (DRIE) is chosen for its capability to achieve both small and large features with high precision [Reference no. 10]. The process starts with a high resistivity intrinsic Si wafer 675 μm thick, where a 1.2 μm thermal oxide is grown (step 1a) and patterned on both sides for the topside and backside DRIE masks (step 1b). The receptacles (18) for the optical fibers (16) are then etched into the backside using DRIE (step 1c), and a plasma-enhanced chemical vapor deposition (PECVD) nitride is deposited as an anti-reflection coating (step 1d) for the window (40). Next, to achieve two different topside etch depths, AZ 1529™ (MicroChemicals GmbH, Ulm, Germany) photoresist is patterned above the topside oxide (step 1e), and the high impedance π-match slot (24) is etched (step 1f). The resist is stripped (step 1g), and the main waveguide channel (20) is etched (step 1h). The topside oxide mask is stripped to improve the electrical connection of the obstacle member 30 (Si post) (step 1i). Deposition of a sputtered 100/1000 nm Ti/Cu layer metalizes the topside waveguide channel (step 1j), and the metal from the sidewalls of the obstacle members (30) (Si posts) are removed by patterning AZ 1529 ™ photoresist (step 1k) and wet chemical etching (step 1l). A negative photoresist resist or image reversal photoresist can be used as an alternative to positive photoresist AZ 1529 ™ to pattern the sidewalls of the obstacle members (30) (Si posts). The individual samples are then diced (step 1m).

Figure 5A:
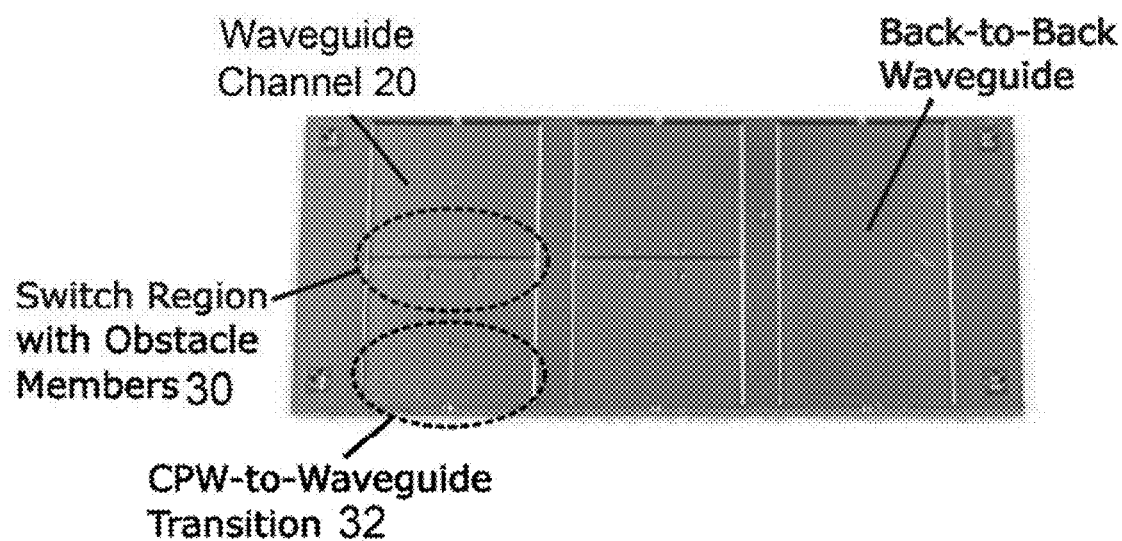
FIG. 5A is a photograph of an embodiment of a top wafer underside of a waveguide assembly of the present invention, highlighting a switch region, the CPW-to-waveguide transition, and a back-to-back waveguide.

FIG. 5A is a photograph of the top wafer piece produced in accordance with (steps 1a-1m) of the process flow of FIG. 4 before the bonding step. FIG. 5A shows the waveguide channel (20) and the switch region including the four obstacle members (30) (Si posts), and the back-to-back waveguide structure for switch loss extraction.

For this embodiment, a borosilicate glass wafer 1.1 mm thick was chosen for the bottom carrier wafer. A 40/1000 nm Ti/Cu layer is patterned using a MicroChem LOR 5B™ (MicroChem Corp., Newton, Massachusetts, USA) lift-off resist, and AZ 1512 ™ (MicroChemicals GmbH, Ulm, Germany) bi-layer lift-off process, and the individual samples are diced (Step 2a).

Figure 5B:
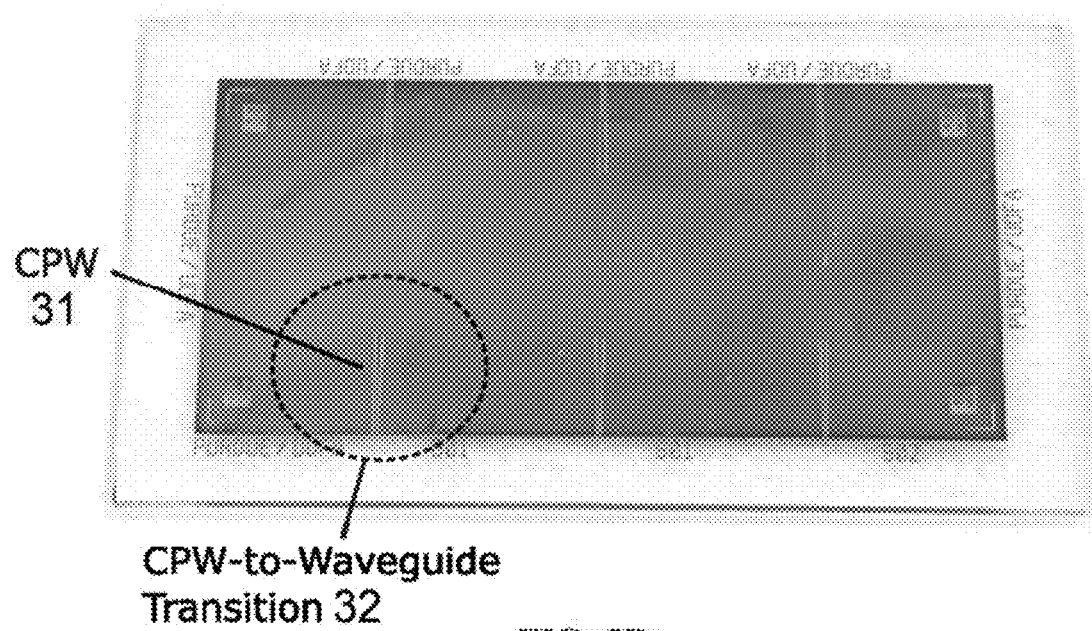
FIG. 5B is a photograph of an embodiment of a bottom wafer topside of a waveguide assembly of the present invention, highlighting the CPW-to-waveguide transition, and a coplanar waveguide.

FIG. 5B is a photograph of the bottom wafer piece produced in accordance with (step 2a) of the process flow of FIG. 4 before the bonding step. FIGS. 5A and 5B show the coplanar waveguide-to-waveguide (CPW-to-waveguide) transition (32) region. The coplanar waveguide transition region accommodates a coplanar waveguide (31)—that is, an electrical planar transmission line which can be fabricated using printed circuit board technology, and that is configured to convey microwave-frequency signals.

Figure 5C:
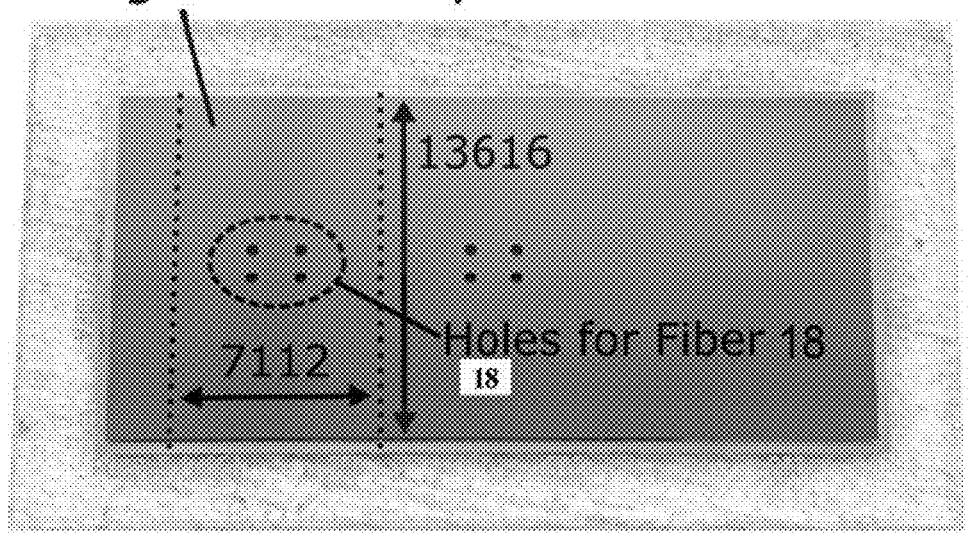
FIG. 5C is a photograph of an embodiment of a waveguide assembly of the present invention, formed by bonding the top wafer shown in FIG. 5A with the bottom wafer shown in FIG. 5B. All dimension are shown in units of μm.
Figure 5D:
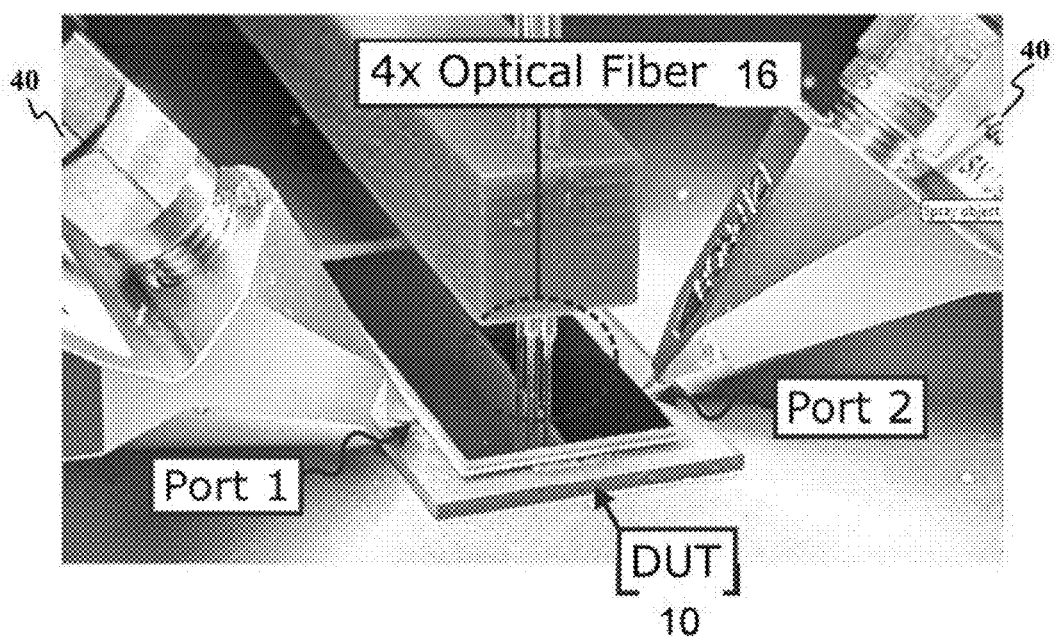
FIG. 5D shows the measurement of the waveguide assembly of FIG. 5C, as a device-under-test (DUT) using two FormFactor |Z| Probes, with four optical fibers inserted into the four holes etched in the backside of the top wafer located above each obstacle member (Si post).

FIG. 5C is a photograph of the fabricated waveguide assembly after bonding the top and bottom wafer pieces, in accordance with the bonding step (step 3a) of FIG. 4 using Cu—Cu thermocompression bonding. FIG. 5C shows the location of receptacles (18) (holes) for the optical fibers (16), and final dimensions of the waveguide assembly including transitions.

To summarize, in this embodiment, the obstacle members (30) (Si Posts) are patterned within a waveguide channel (20) using deep reactive ion etching. The waveguide channel (20) is metalized using physical vapour deposition, and the metal coating on the obstacle members (30) is removed using photolithography. A portion of the wafer (10) is bonded to another metalized carrier portion of the wafer (10) using thermocompression bonding, forming the waveguide assembly within the wafer (10). The choice of silicon micromachining processes using deep reactive ion etching allows for low cost, high precision fabrication with customizable design of the waveguide channel (10) and obstacle members (30) (Si posts) dependent upon application need, along with direct integration with other integrated circuits or systems. In other embodiments, other semiconductor micromachining processes including anisotropic etching using potassium hydroxide (KOH) or tetramethyl ammonium hydroxide (TMAH) are also applicable. See also Reference no. 15 for other methods for anisotropic etching of silicon structures that may be applied to the method of the present invention.

Example 3—Solid State Plasma Switch or Variable Attenuator

FIG. 5D is a photograph of a test setup for the waveguide assembly shown in FIG. 5C to characterize the effect of the waveguide switch on transmission of an RF signal in the CPW-to-waveguide region shown in FIG. 5C. FIG. 5D shows the wafer (10) with the integrated waveguide assembly as the device-under-test (DUT).

FIG. 5D shows measurement probes (50), with the four optical fibers (16) inserted into the receptacles (18) (holes) located directly above the obstacle members (30) (Si posts). An ER emitter (100) (not shown) emitted electromagnetic radiation at wavelength $\lambda_{opt}$=915 nm ($h\nu_{opt}$=1.36 eV) to be within the range of high quantum efficiency for Si [Reference no. 14].

Figure 6:
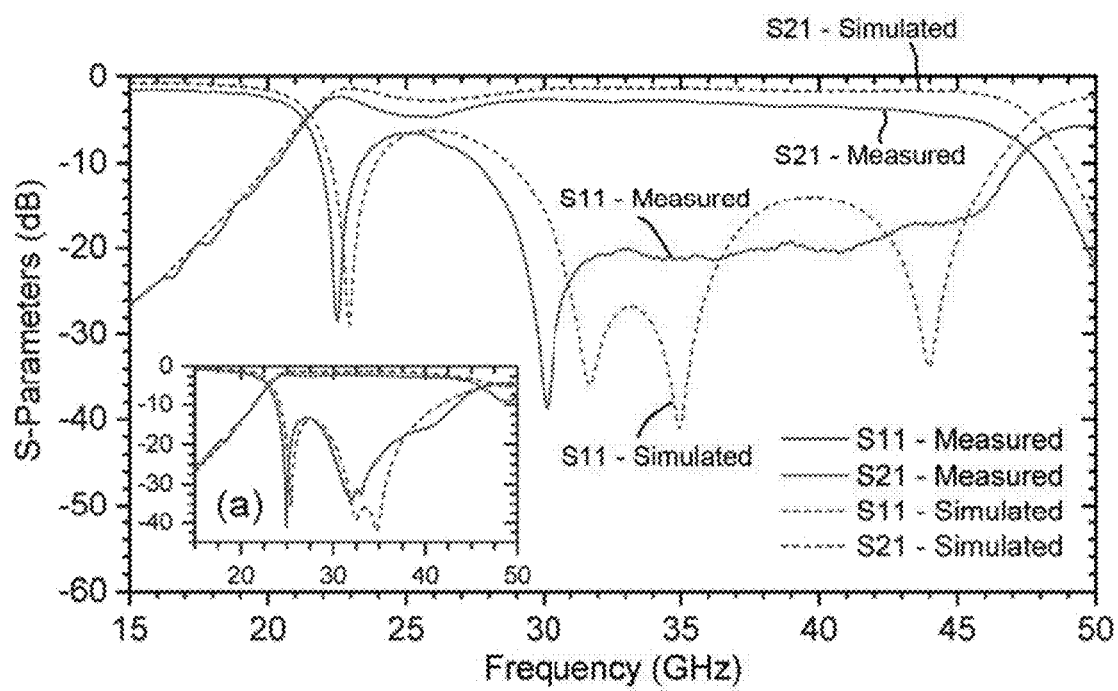
FIG. 6 is a chart showing measured and HFSS™ simulated ON-state scattering parameters for an embodiment of the waveguide assembly of FIG. 5C, and its back-to-back waveguide structure (see inset chart (a) of FIG. 6). The conductivity of copper for HFSS™ simulation was $2.3 \times 10^7$ S/m, determined by measurement using a four-point probe after the wafer bonding step.

FIG. 6 plots the measured and simulated scattering parameters when the waveguide assembly is in the "ON-state"—that is, when the obstacle member (30) is not subjected to applied electromagnetic radiation. At 35 GHz, the measured insertion loss is 2.86 dB, with return loss greater than 20 dB from 29.2 GHz to 41.6 GHZ, both including CPW-to-waveguide transitions. To extract the transition losses, a back-to-back waveguide, as shown in FIG. 5A, was also measured, with scattering parameters shown in FIG. 6, inset (a). With a measured back-to-back insertion loss of 2.34 dB at 35 GHZ, the extracted loss of the switch itself is 0.52 dB, while the net impact of the switch element across the entire band from 30 GHz to 40 GHz is below 0.88 dB.

Figure 7:
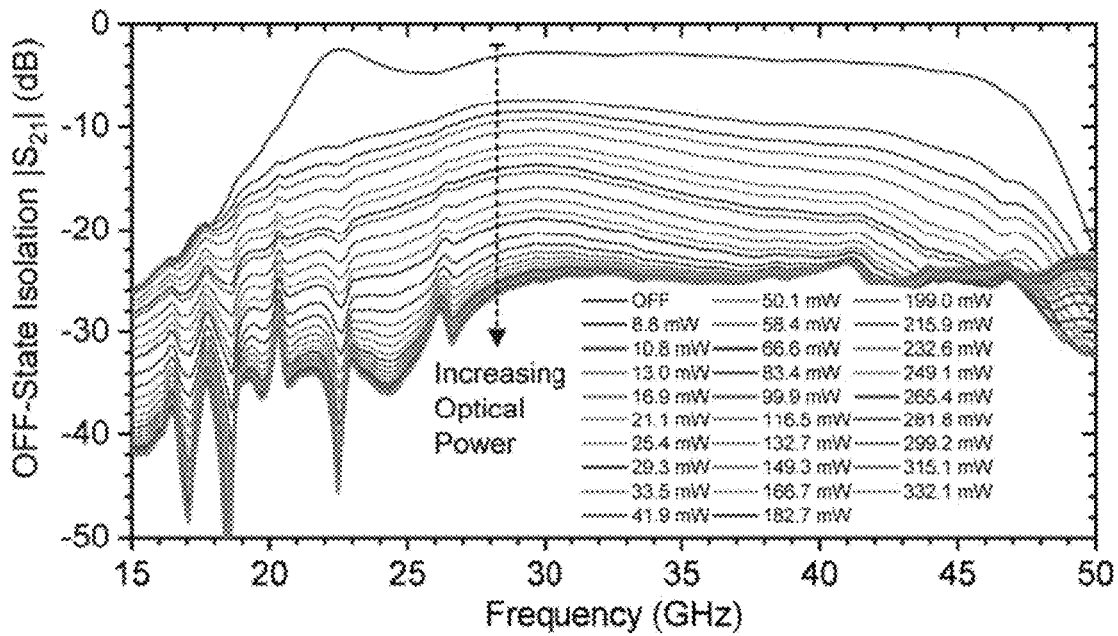
FIG. 7 is a chart showing measured OFF-state isolation (|S21|) for the waveguide assembly of FIG. 5C, with increasing optical fiber output power. The value shown is the power at the output of each individual fiber for the two-by-two array of obstacle members (Si posts) shown in FIG. 5A.

FIG. 7 plots the measured isolation ($|S_{21}|$) when the waveguide assembly is in the "OFF-state"—that is, when the obstacle member (30) is subjected to electromagnetic radiation from ER emitter (100)—for increasing optical power at the output of each optical fiber (16). At 35 GHz, for an optical power of 50.1 mW, the measured isolation is 20 dB, while for an optical power of 166.7 mW, the measured isolation is 25 dB. This is significant isolation for this frequency range, and clearly demonstrates the potential of the waveguide assembly for mm-wave switch applications. These results are consistent with the principle of operation described above. That is, as increasing energy level of electromagnetic radiation is applied to obstacle members (30), their conductance increases. This increases the effect of the obstacle member (30) in reflecting incoming microwave and millimeter-wave signals, and thus provides higher isolation from the input port to the output port of waveguide channel (20).

FIG. 7 shows that with increasing optical power, there is a saturation point, where any further increase in optical power no longer returns a significant change in isolation. Using equations (1) to (3) (above), the average DC bulk conductivity for 25 dB isolation is approximately 281 S/m. Increasing the optical power further will improve the total loss in the system by increasing the conductivity of the post.

The results demonstrate use of the obstacle member (30) as a waveguide switch for RF signals in $K_a$-band, within the waveguide channel (20) of semiconductor wafer (10). The measured OFF-state isolation was greater than 20 dB across the entire band from 30-40 GHz. The extracted measured ON-state insertion loss was 0.52 dB at 35 GHz. The waveguide switch is useful for switching of mm-wave signals within semiconductor micromachined waveguides for communication or radar systems requiring high performance and high power handling.

The semiconductor obstacle member (30) inside the waveguide channel can be designed and the optical power incident on the obstacle member (30) can be tuned such that the obstacle member (30) input impedance matches to the characteristic impedance of the waveguide channel (20). Thus, it is possible that the electromagnetic energy incident on the semiconductor obstacle member (30) is fully absorbed by the obstacle member (30) in the OFF-state, with a very limited amount of power either reflected or transmitted. Absorptive switches are useful in applications where high reflected power can damage upstream RF components or equipment.

Further, by adjusting the amount of optical power incident on the semiconductor obstacle member (30), a variable amount of OFF-state isolation can be achieved. Thus, a variable attenuator can be designed using the obstacle member (30). Attenuators have applications where microwave or millimeter-wave signal levels need to be controlled, i.e., where high signal levels need to be reduced to protect down-stream components or equipment. Variable attenuators are extremely useful for applications where the signal level needs to be continuously varied, where the signal level needs to be continuously leveled, or even where the signal level needs to be changed only once in a while, but it is much cheaper not to replace the entire component, i.e., in the case of a fixed attenuator.

Example 4—T-Match Solid State Plasma Waveguide Switch

Figure 8A:
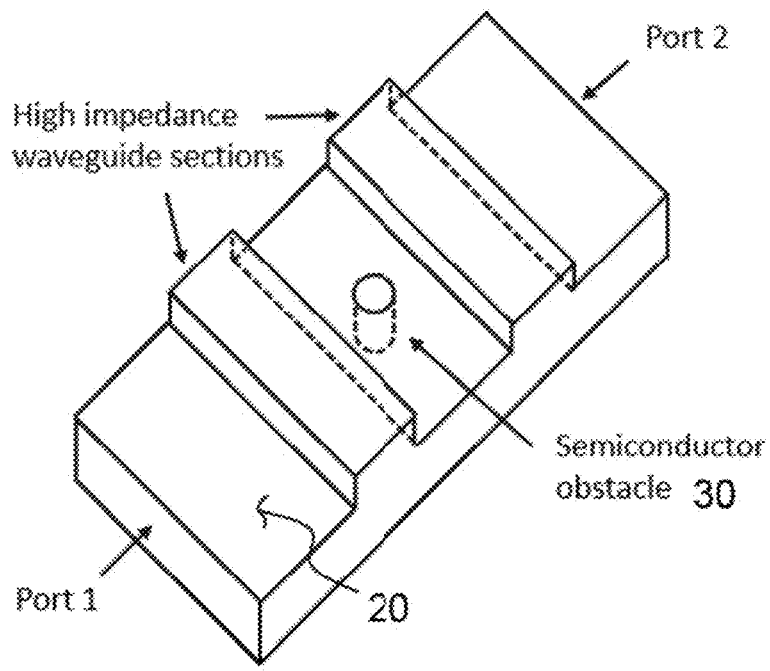
FIG. 8A shows an isometric view of a layout of another embodiment of a waveguide assembly of the present invention, with the top layer removed to show the internal structure, which can be used as a T-match solid state plasma waveguide switch.
Figure 8B:
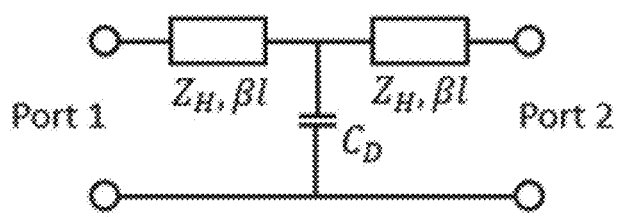
FIG. 8B shows an equivalent circuit diagram for the waveguide assembly of FIG. 8A.

Referring to FIG. 8A, a T-match circuit can be constructed for the present invention by inserting a high impedance waveguide section before and after the semiconductor obstacle member (30). A high impedance section within a waveguide channel (20) can be realized by increasing the height of the waveguide wall within the desired section. It is known that the characteristic impedance of a waveguide channel (20) is proportional to the channel height [See reference no. 16]. As known to persons skilled in the art, "T-match" refers to an electrical circuit used to match the impedance between two points, usually a source and a load, where the inductor and the capacitor can be arranged in the shape of a letter "T" in a corresponding schematic diagram, such as shown in FIG. 8B.

The T-match is useful for improving the insertion loss and return loss for large shunt capacitive loadings in the ON-state of the solid state plasma obstacle member (30) without substantially increasing the total size or increasing the number of obstacle member (30) of the waveguide assembly. However, with the T-match, there is a maximum shunt capacitive loading that can be matched to with reasonable high impedance sections.

Example 5—Π-Match Solid State Plasma Waveguide Switch

As discussed above FIG. 3A shows the design layout of a waveguide assembly with a high impedance π-match section located between four obstacle members (30) (silicon posts).

Figure 9A:
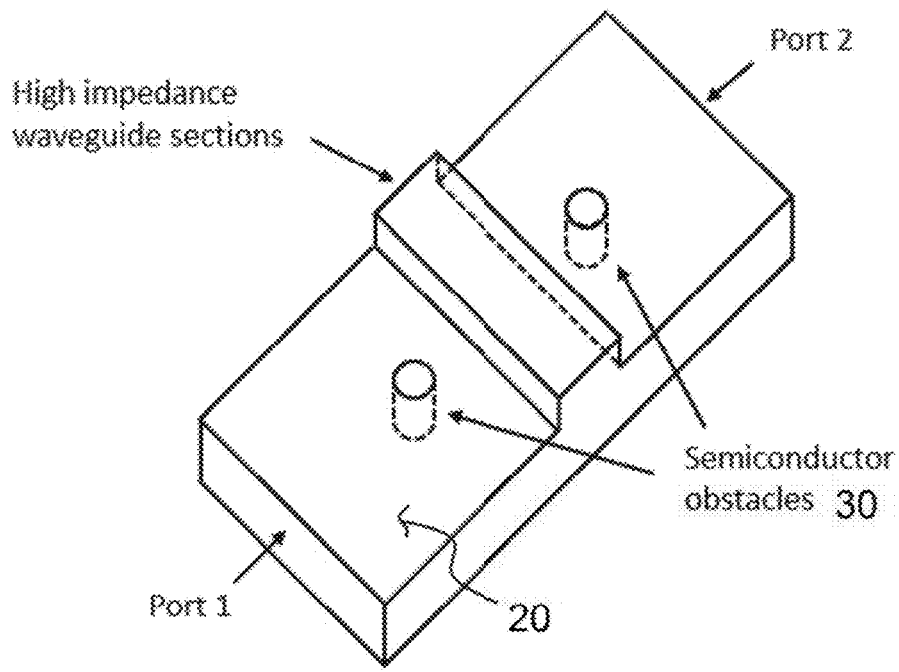
FIG. 9A shows an isometric view of a layout of another embodiment of a waveguide assembly of the present invention, with the top layer removed to show the internal structure, which can be used as a Π-match solid state plasma waveguide switch.
Figure 9B:
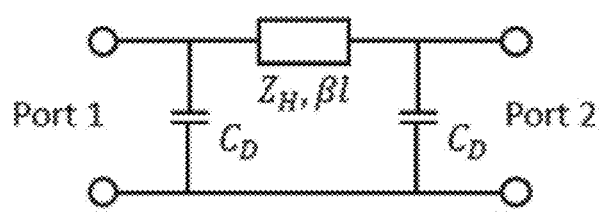
FIG. 9B shows an equivalent circuit diagram for the waveguide assembly of FIG. 9A.

FIG. 9A shows another π-match circuit constructed by inserting a high impedance waveguide section between two obstacle members (30), acting as shunt capacitive loadings. To maximize the amount of OFF-state isolation, the impedance of the π-match should match the characteristic impedance of the waveguide channel (20), with a length of approximately λ/4. To decrease the length of the π-match section, and the overall size of the waveguide assembly, the impedance of the π-match section can be increased by increasing the height of the lower wall of the waveguide channel (20) within the π-match section. The design will suffer a small decrease in OFF-state isolation, but a smaller switch form factor will be gained. Furthermore, compared to the T-match circuit, there is always a solution for the π-match circuit for a given shunt capacitive loading. The Π-match switch results in wide ON-state bandwidth with low insertion loss, and high OFF-state isolation. As known to persons skilled in the art, "Π-match" or "Pi-match" refers to an electrical circuit used to match the impedance between two points, usually a source and a load, where the inductor and the capacitors can be arranged in the shape of the character "Π" in a corresponding schematic diagram, such as shown in FIG. 9B.

Example 6—Single-Pole n-Throw Solid State Plasma Waveguide Switch

Figure 10:
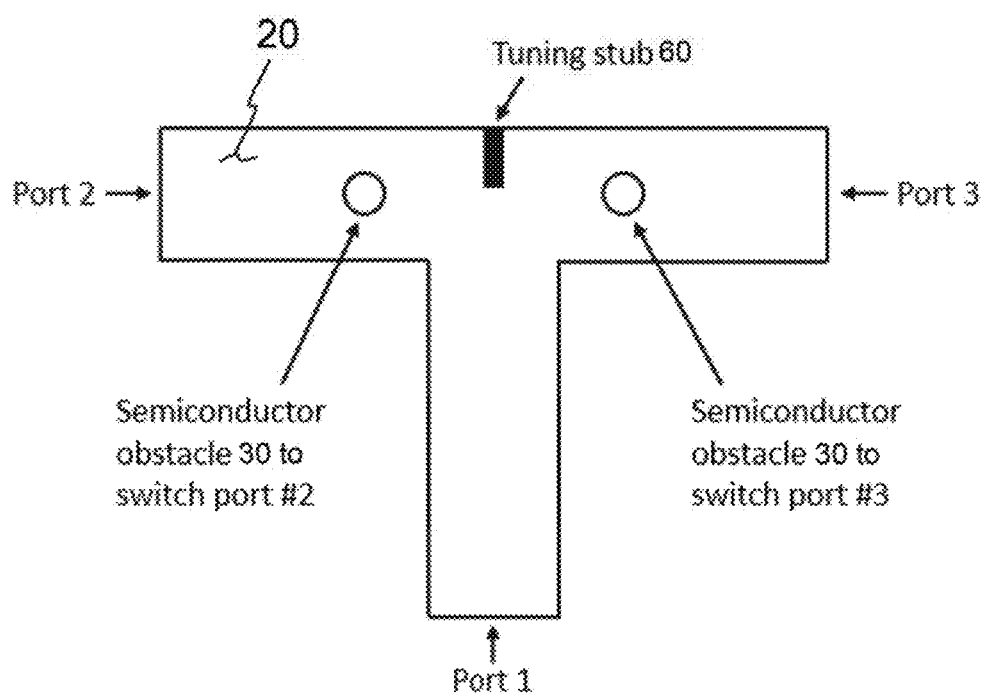
FIG. 10 shows a top view of an embodiment of a layout of waveguide assembly of the present invention, which can be used as a single-pole N-throw solid state plasma waveguide switch.

Referring to FIG. 10, a single-pole N-throw solid state plasma waveguide switch can be designed using a corporate feed structure (see Reference no. 17 for details) along with the proposed semiconductor obstacle members (30). In FIG. 10, a corporate feed structure splits the incoming wave from port 1 into two separate paths towards port 2 and port 3 of waveguide channel (20). An equal or unequal power split can be designed for. A tuning stub (60) located between the two branches of port 2 and port 3 can be added for improved matching and bandwidth. In embodiments, the tuning stub (60) could be patterned and coated with metal the same way as the waveguide channel (20) sidewalls are coated with metallic layer (22), or the tuning slab (60) could be a semiconductor obstacle stimulated with electromagnetic radiation for tunable matching. A semiconductor obstacle member (30) is placed in each path to allow the switching of signals through each path. The placement and design of the semiconductor obstacle member (30) can follow the earlier described implementations to optimize ON-state return loss and insertion loss, along with OFF-state isolation. Additional paths (arms or branches) or multiple corporate feed structures with semiconductor obstacle members (30) can be utilized to increase the number of output ports from two (as shown in FIG. 10) to allow N ports.

Example 7—Evanescent-Mode Bandpass Filter Waveguide Switch

To significantly improve the OFF-state isolation and to increase the DC power efficiency, an evanescent-mode waveguide switch implementation can be utilized [See Reference nos. 18 and 19].

Figure 11A:
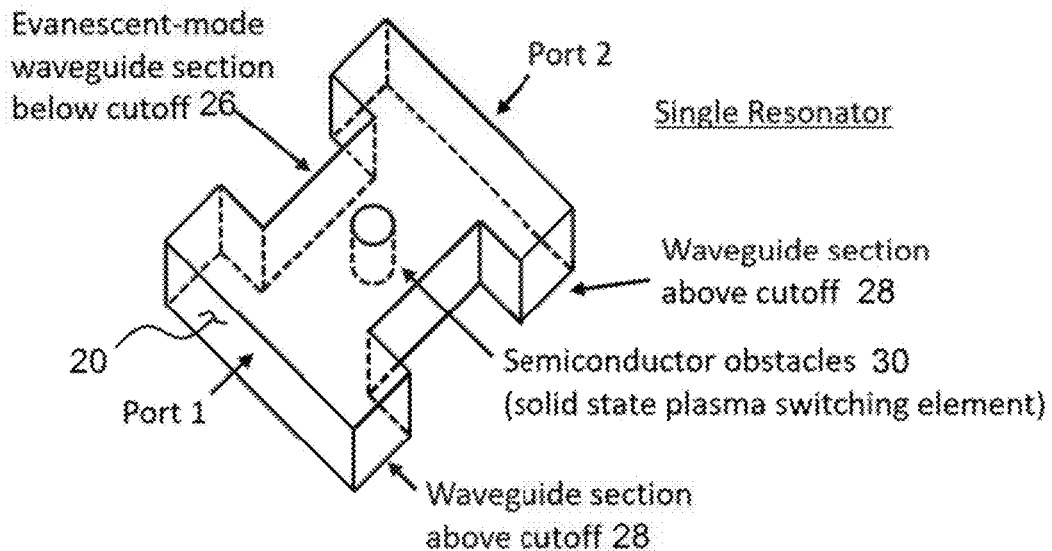
FIG. 11A shows an isometric view of an embodiment of a layout of a waveguide assembly of the present invention, which can be used as an evanescent-mode bandpass filter waveguide switch.

Referring to FIG. 11A, a reduced width waveguide section (26) of waveguide channel (20) operating below the cutoff frequency of its fundamental $TE_{1,0}$ mode (i.e., operating in an evanescent mode) is inserted between two waveguide sections (28) of waveguide channel (20) operating above the cutoff frequency of their fundamental $TE_{1,0}$ mode (i.e., operating within the standard waveguide monomode region).

Figure 11B:
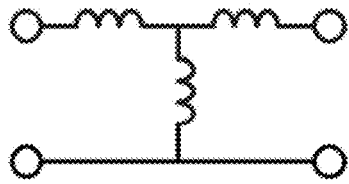
FIG. 11B shows an equivalent circuit diagram for the evanescent-mode waveguide channel of the waveguide assembly of FIG. 11A.
Figure 11C:
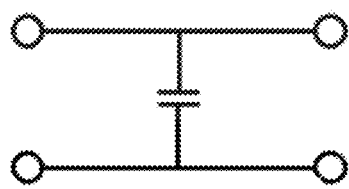
FIG. 11C shows an equivalent circuit diagram for the obstacle member of the waveguide assembly of FIG. 11A, when the obstacle member is in the dark (capacitive) state.
Figure 11D:
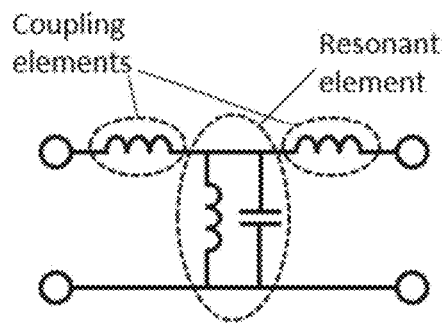
FIG. 11D shows an equivalent circuit diagram for the waveguide assembly of FIG. 11A, when the obstacle member thereof is in the dark (capacitive) state, inside the evanescent-mode waveguide channel.
Figure 12A:
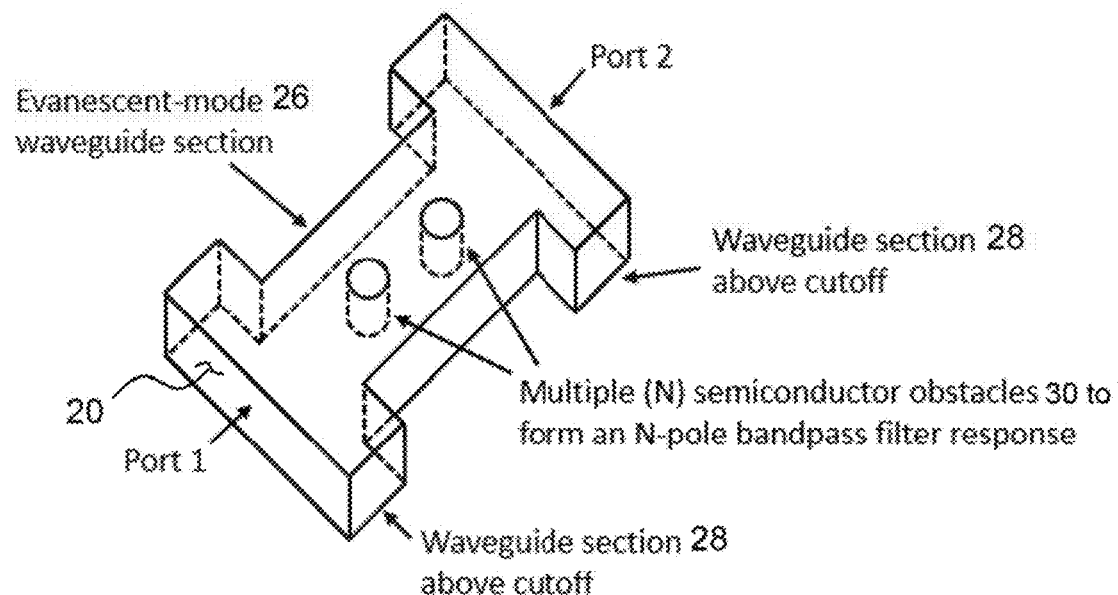
FIG. 12A shows an isometric view of another embodiment of a layout of a waveguide assembly of the present invention, which can be used as an N-pole evanescent-mode bandpass filter waveguide switch.
Figure 12B:
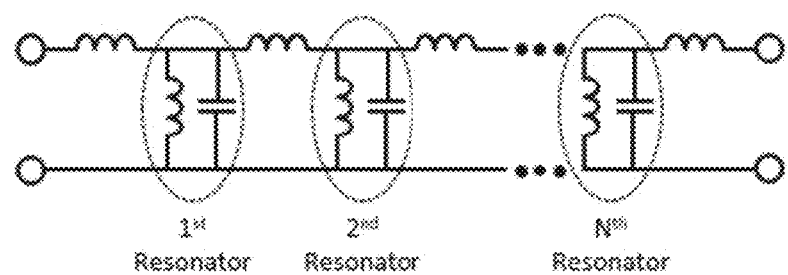
FIG. 12B shows an equivalent circuit diagram of the waveguide assembly of FIG. 12A.

As shown in FIG. 11B, a waveguide operating below cutoff can be modeled as either an inductively-loaded T-section or π-section equivalent circuit. Furthermore, a semiconductor obstacle member (30) inside a waveguide channel (20) operating in its dark state (i.e., no electromagnetic radiation excitation) can be modeled with a capacitor in shunt, as shown in FIG. 11C. By inserting the semiconductor obstacle member (30) inside the evanescent mode waveguide section (26) as shown in FIG. 11A, its shunt capacitance combines in parallel with the shunt inductance shown in FIG. 11B, forming a resonator element, as shown in the equivalent diagram of FIG. 11D. The series inductances can provide the coupling between resonators. Thus, a filtering transfer function can be formed between the two standard waveguide sections (28). By adding multiple semiconductor obstacle members (30), a multi-pole filter can be constructed, as shown in FIG. 12A, with an equivalent circuit shown in FIG. 12B.

By exciting the semiconductor obstacle member (30) with electromagnetic radiation, a solid state plasma is formed, the obstacle member (30) becomes conductive, and the waveguide changes from a filter to a switch, blocking the transmission of electromagnetic waves. Due to the reduced transverse width waveguide section (26), the amount of isolation provided by the obstacle member (30) is increased compared to the same size obstacle member (30) within the larger main waveguide section (28). This is due to the obstacle member (30) blocking more of the incoming electromagnetic wave. Furthermore, the high attenuation of the evanescent mode within the reduced width waveguide section (26) also improves the amount of isolation achieved by the switch.

The benefits of the solid state plasma switching element over PIN diodes is simplified integration, decoupled DC bias network, higher power handling, and lower insertion losses.

Example 8—Optically Tunable and Reconfigurable Solid State Plasma Waveguide Cavity Resonators In this example, a semiconductor obstacle member (30) in which a solid state plasma is excited by electromagnetic radiation within can be utilized inside a waveguide channel (20) cavity (either rectangular or cylindrical) to tune the resonance frequency of the cavity, to tune the input/output coupling from the cavity, or to tune the inter-resonator coupling between two cavities, i.e., for a bandpass filter response.

Figure 13A:
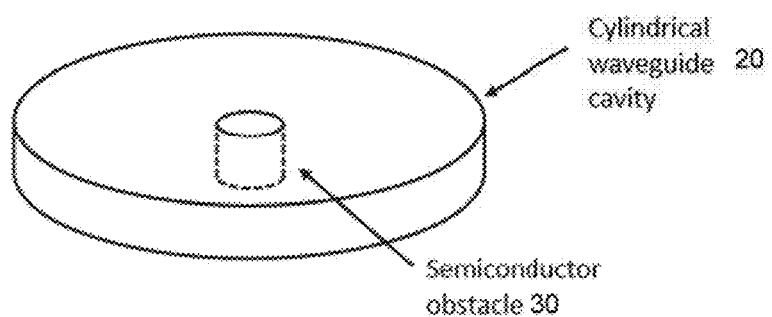
FIG. 13A shows an isometric view of an embodiment of a layout of a waveguide assembly of the present invention, which can be used as an optically tunable and reconfigurable solid state plasma waveguide cavity resonator.
Figure 13B:
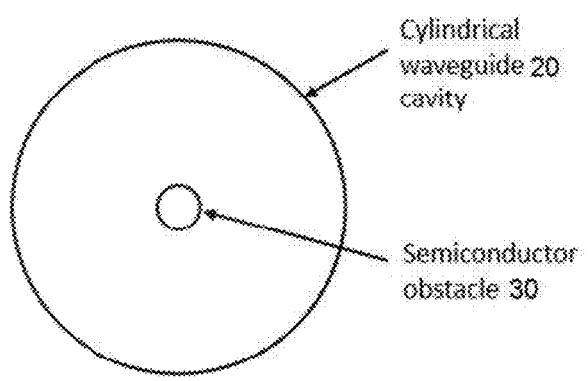
FIG. 13B shows a top plan view of the waveguide assembly of FIG. 13A

As an example of the embodiment, referring to FIGS. 13A and 13B, a semiconductor obstacle member (30) is placed within a cylindrical waveguide channel (20) cavity. Here, the obstacle member (30) is positioned within the center of the cavity for maximum tunability. However, the choice of obstacle member (30) position can be changed based on design requirements, where the amount of coupling to the resonant electric or magnetic fields located inside the cavity can be optimized. With the semiconductor obstacle member (30) in the dark state (i.e., no electromagnetic radiation excitation), the cavity is dielectrically loaded by the obstacle member (30), and its fundamental resonance mode will be at a particular frequency. When the semiconductor obstacle member (30) is excited by electromagnetic radiation, generating a solid state plasma within, the fields inside the waveguide channel (20) cavity will re-orient based on the new boundary condition introduced by the now conductive obstacle member (30), and the fundamental resonance frequency will shift. Thus, tuning of the waveguide cavity resonance frequency can be achieved.

Figure 14:
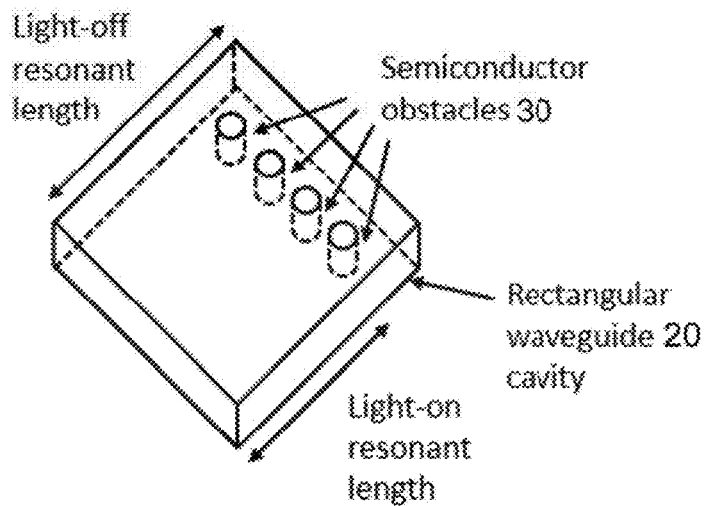
FIG. 14 shows an isometric view of another embodiment of a layout of a waveguide assembly of the present invention, which can be used as an optically tunable and reconfigurable solid state plasma waveguide cavity resonator.

As another example of the embodiment, referring to FIG. 14, semiconductor obstacle members (30) inserted inside a waveguide channel (20) can be used as a reconfigurable sidewall of a waveguide cavity resonator. As shown in FIG. 14, a rectangular waveguide channel (20) cavity has four semiconductor obstacle members (30) placed in such a way as to electrically form a new sidewall of the waveguide channel (20) when excited by electromagnetic radiation to form a solid state plasma, thus changing the resonant length of the waveguide channel (20) cavity and its fundamental resonance frequency. Different shapes of waveguide channel (20) cavities can also be applied with this embodiment, i.e., cylindrical waveguide cavity. Furthermore, the size, number, and shape of the semiconductor obstacle members (30) can be optimized for a particular design application.

Figure 15:
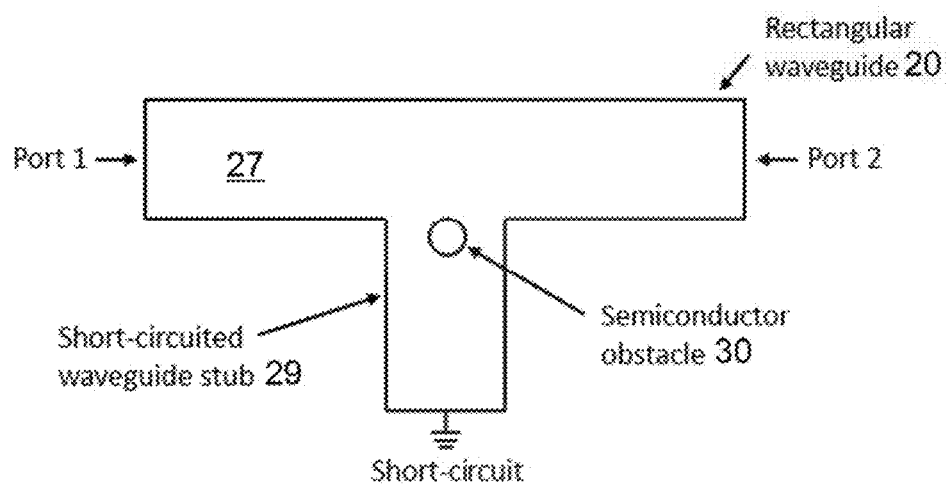
FIG. 15 shows a top plan view of an embodiment of a layout of a waveguide assembly of the present invention, which can be used as an optically tunable solid state plasma waveguide impedance matching network or phase shifter.

Example 9—Optically Tuned Solid State Plasma Waveguide Impedance Matching Networks and Phase Shifters In FIG. 15, the waveguide channel (20) includes a short-circuited waveguide stub path (29) extending away from a primary path (27) from Port 1 to Port 2. The stub path (29) can be used to tune the input and output impedance of a waveguide channel (20) section, thus making a tunable or reconfigurable impedance matching network. For example, in FIG. 15, by placing a semiconductor obstacle member (30) at the input to an H-plane short-circuited waveguide stub path (29), the input impedance of the stub path (29) can be reconfigured, thus changing the input/output impedance looking into the waveguide ports 1 and 2. Additional stub paths (29) (not shown) can be added to make double-stub, triple-stub, or multi-stub impedance matching networks.

Figure 16:
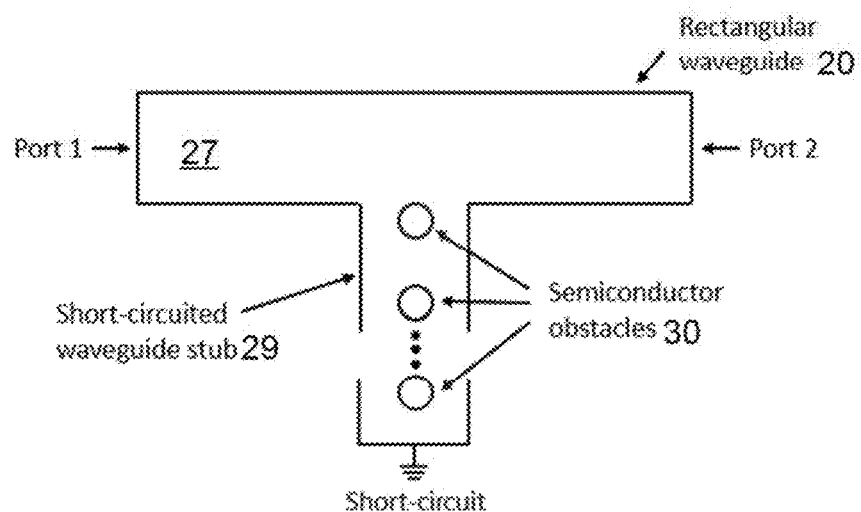
FIG. 16 shows a top plan view of another embodiment of a waveguide assembly of the present invention, which can be used as an optically tunable solid state plasma waveguide impedance matching network or phase shifter.

Referring to FIG. 16, multiple semiconductor obstacle members (30) can be placed at different lengths down the short-circuited waveguide stub path (29), thus reconfiguring the amount of input impedance looking into the waveguide stub path (29), and allowing for additional tuning states.

By utilizing multiple reconfigurable solid state plasma short-circuited waveguide stub paths (29) loading a waveguide section, a distributed waveguide phase shifter can be designed. The electromagnetic excitation of the semiconductor obstacle member (30) in each waveguide stub path (29), as shown in FIG. 15, will shift the amount of phase of the transmission coefficient between port 1 and port 2 by a certain degree as designed. By switching on or off different stubs (29), an increasing/decreasing amount of phase change can be generated. Furthermore, the amount of phase change introduced by a single stub (29) can be tuned by using multiple semiconductor obstacle members (30), as shown in FIG. 16.

Other types of waveguide phase shifter topologies can be realized using the solid state plasma switching element of the reported invention, including reflection-based phase shifters and switched line phase shifters.

Interpretation.

The corresponding structures, materials, acts, and equivalents of all means or steps plus function elements in the claims appended to this specification are intended to include any structure, material, or act for performing the function in combination with other claimed elements as specifically claimed.

References in the specification to "one embodiment", "an embodiment", etc., indicate that the embodiment described may include a particular aspect, feature, structure, or characteristic, but not every embodiment necessarily includes that aspect, feature, structure, or characteristic. Moreover, such phrases may, but do not necessarily, refer to the same embodiment referred to in other portions of the specification. Further, when a particular aspect, feature, structure, or characteristic is described in connection with an embodiment, it is within the knowledge of one skilled in the art to affect or connect such module, aspect, feature, structure, or characteristic with other embodiments, whether or not explicitly described. In other words, any module, element or feature may be combined with any other element or feature in different embodiments, unless there is an obvious or inherent incompatibility, or it is specifically excluded.

It is further noted that the claims may be drafted to exclude any optional element. As such, this statement is intended to serve as antecedent basis for the use of exclusive terminology, such as "solely," "only," and the like, in connection with the recitation of claim elements or use of a "negative" limitation. The terms "preferably," "preferred," "prefer," "optionally," "may," and similar terms are used to indicate that an item, condition or step being referred to is an optional (not required) feature of a given aspect of the invention.

The singular forms "a," "an," and "the" include the plural reference unless the context clearly dictates otherwise. The term "and/or" means any one of the items, any combination of the items, or all of the items with which this term is associated. The phrase "one or more" is readily understood by one of skill in the art, particularly when read in context of its usage.

The term "about" can refer to a variation of ±5%, ±10%, ±20%, or ±25% of the value specified. For example, "about 50" percent can in some embodiments carry a variation from 45 to 55 percent. For integer ranges, the term "about" can include one or two integers greater than and/or less than a recited integer at each end of the range. Unless indicated otherwise herein, the term "about" is intended to include values and ranges proximate to the recited range that are equivalent in terms of the functionality of the composition, or the embodiment.

As will be understood by one skilled in the art, for any and all purposes, particularly in terms of providing a written description, all ranges recited herein also encompass any and all possible sub-ranges and combinations of sub-ranges thereof, as well as the individual values making up the range, particularly integer values. A recited range includes each specific value, integer, decimal, or identity within the range. Any listed range can be easily recognized as sufficiently describing and enabling the same range being broken down into at least equal halves, thirds, quarters, fifths, or tenths. As a non-limiting example, each range discussed herein can be readily broken down into a lower third, middle third and upper third, etc.

As will also be understood by one skilled in the art, all language such as "up to", "at least", "greater than", "less than", "more than", "or more", and the like, include the number recited and such terms refer to ranges that can be subsequently broken down into sub-ranges as discussed above. In the same manner, all ratios recited herein also include all sub-ratios falling within the broader ratio.

REFERENCES

The following publications are referenced herein, as noted by the below Reference numbers.

1. U. Shah et al., "A 500-750 GHz RF MEMS waveguide switch," IEEE Trans. Terahertz Sci. Technol., vol. 7, no. 3, pp. 326-334, May 2017.
2. "QuinStar Technology Inc." [Online]. Available: https://quinstar.com/shop/control-products-ferrite/waveguide-pin-switches-single-double-throw/waveguide-pin-switches-double-throw-qss-qsd/. [Accessed: Feb. 1, 2021].
3. D. Psychogiou et al., "Millimeter-wave phase shifter based on waveguide-mounted RF-MEMS," Microw. Opt. Technol. Lett., vol. 55, no. 3, pp. 465-468, March 2013.
4. N. Vahabisani and M. Daneshmand, "Monolithic millimeter-wave MEMS waveguide switch," IEEE Trans. Microw. Theory Tech., vol. 63, no. 2, pp. 340-351, February 2015.
5. C. H. Chen and D. Peroulis, "RF design, power handling, and hot switching of waveguide water-based absorptive switches," IEEE Trans. Microw. Theory Tech., vol. 57, no. 1, pp. 2038-246 August 2009.
6. C. Gamlath, D. Benton, and M. Cryan, "Microwave properties of an inhomogeneous optically illuminated plasma in a microstrip gap," IEEE Trans. Microw. Theory Tech., vol. 63, no. 2, pp. 374-383, February 2015.
7. C. H. Lee, P. S. Mak, and A. P. Defonzo, "Optical Control of Millimeter-Wave Propagation in Dielectric Waveguides," IEEE J. Quantum Electron., vol. 16, no. 3, pp. 277-288, 1980.
8. A. W. Pang, C. D. Gamlath, and M. J. Cryan, "An optically controlled coplanar waveguide millimeter-wave switch," IEEE Microw. Wirel. Components Lett., vol. 28, no. 8, pp. 669-671, 2018.
9. J. Ren, Z. Jiang, P. Fay, J. L. Hesler, C. Y. E. Tong, and L. Liu, "High-performance WR-4.3 optically controlled variable attenuator with 60-dB range," IEEE Microw. Wirel. Components Lett., vol. 28, no. 6, pp. 512-514, June 2018.
10. A. Krivovitca, U. Shah, O. Glubokov, and J. Oberhammer, "Micromachined silicon-core substrate-integrated waveguides at 220-330 GHz," IEEE Trans. Microw. Theory Tech., vol. PP, pp. 1-9, 2020.
11. D. A. Neamen, Semiconductor Physics and Deviecs: Basic Principles, 4th ed. New York: McGraw-Hill, 2012.
12. A. Kannegulla, M. I. Bin Shams, L. Liu, and L.-J. Cheng, "Photo-induced spatial modulation of THz waves: opportunities and limitations," Opt. Express, vol. 23, no. 25, pp. 32098-32112, December 2015.
13. G. M. Rebeiz, RF MEMS Theory, Design, and Technology. Hoboken, NJ: John Wiley & Sons, Inc., 2003.
14. S. M. Sze, Semiconductor Devices: Physics and Technology, 2nd ed. New York: John Wiley & Sons, Inc., 2002.
15. U.S. Pat. No. 6,531,068B2, titled "Method of anisotropic etching of silicon", published (Laermer et al.; Mar. 11, 2003).
16. P. A. Rizzi, Microwave Engineering: Passive Circuits. Englewood Cliffs, NJ: Prentice Hall, 1998.
17. S. H. Shehab, N. C. Karmakar, and J. Walker, "Substrate-integrated-waveguide power dividers," *IEEE Antennas Propag. Mag.*, vol. 62, no. 4, pp. 27-38, August 2020.
18. G. F. Craven and C. K. Mok, "The design of evanescent mode waveguide bandpass filters for a prescribed insertion loss characteristic," IEEE Trans. Microw. Theory Tech., vol. 19, no. 3, pp. 295-308, March 1971.
19. T. Sickel, P. Meyer, and P. W. Van Der Walt, "An in situ tunable diode mounting topology for high-power X-band waveguide switches," IEEE Trans. Microw. Theory Tech., vol. 55, no. 2, pp. 281-285, 2007.
20. Z. Baghchehsaraei and J. Oberhammer, "Parameter analysis of millimeter-wave waveguide switch based on a MEMS-reconfigurable surface," IEEE Transactions on Microwave Theory and Techniques, vol. 61, no. 12, pp. 4396-446 December 2013.
21. L. Pelliccia, F. Cacciamani, P. Farinelli, and R. Sorrentino, "High-Q tunable waveguide filters using ohmic RF MEMS switches," IEEE Transactions on Microwave Theory and Techniques, vol. 63, no. 10, pp. 3381-3390 October 2015.

22. J. Campion, Y. Li, H. Zirath, J. Oberhammer, A. Hassona, Z. S. He, B. Beuerle, A. Gomez-Torrent, U. Shah, S. Vecchiattini, R. Lindman, and T. S. Dahl, "Toward industrial exploitation of THz frequencies: integration of SiGe MMICs in silicon-micromachined waveguide systems," IEEE Transactions on Terahertz Science and Technology, vol. 9, no. 6, pp. 624-636, November 2019.
23. A. W. Pang, S. Bensmida, and M. J. Cryan, "Nonlinearity and Power Handling Characterization of an Optically Reconfigurable Microwave Switch," in IEEE MTT-S International Microwave Symposium Digest, Philadelphia, PA, June 2018, pp. 420-422.
24. E. K. Kowalczuk, C. J. Panagamuwa, and R. D. Seager, "Design and operation influences regarding rise and fall time of a photoconductive microwave switch," in Loughborough Antennas and Propagation Conference, LAPC, Loughborough, UK, November 2013, pp. 149-154.
25. A. Fisher, Z. Missen, T. Jones, and D. Peroulis, "A fiber-free DC-7 GHz 35 W integrated semiconductor plasma switch," in IEEE International Microwave Symposium, IMS, Atlanta, GA, June 2021, pp. 1-4.

What is claimed is:

1. A system for impeding a radio frequency (RF) signal, the system comprising a waveguide assembly integrated with a semiconductor wafer and comprising:
   a waveguide channel defined by internal walls of the semiconductor wafer lined with a metallic layer comprising gold, copper, nickel, aluminum, chromium, titanium tungsten, platinum, or silver, the waveguide channel comprising:
      at least one port for transmission of the RF signal into or out of the waveguide channel;
      a first waveguide channel section;
      a second waveguide channel section; and
      a third waveguide channel section,
      wherein the first waveguide channel section is disposed between the second waveguide channel section and the third waveguide channel section, and
      wherein a channel transverse width of the first waveguide channel section is less than a channel transverse width of the second waveguide channel section and the third waveguide channel section, and
   at least one semiconductor obstacle member disposed in the waveguide channel in the first waveguide channel section,
   wherein the at least one semiconductor obstacle member is responsive to applied electromagnetic radiation to vary electrical conductance of the at least one semiconductor obstacle member, and thereby vary the electrical impedance of the at least one semiconductor obstacle member to transmission of the RF signal through the waveguide channel.

2. The system of claim 1, wherein the waveguide channel further comprises a fourth waveguide channel section and a fifth waveguide channel section, wherein a channel height of the fourth waveguide channel section is greater than a channel height of the fifth waveguide channel section, such that an electrical impedance of the fourth waveguide channel section is greater than an electrical impedance of the fifth waveguide channel section.

3. The system of claim 1, wherein:
   the at least one port of the waveguide channel comprises an input port, a first output port and a second output port disposed apart from the first output port;
   the waveguide channel defines a first path from the input port to the first output port;
   the waveguide channel defines a second path from the input port to the second output port, and separate from the first path; and
   the at least one semiconductor obstacle member comprises a first obstacle member disposed in the first path, and a second obstacle member disposed in the second path.

4. The system of claim 3, wherein the waveguide assembly further comprises a tuning stub disposed between the first path and the second path.

5. The system of claim 1, wherein:
   the at least one port of the waveguide channel comprises an input port and an output port;
   the waveguide channel defines a primary path from the input port to the output port, and a short-circuited stub path extending from the primary path; and
   the at least one semiconductor obstacle member is disposed in the stub path.

6. The system of claim 1, wherein the at least one semiconductor obstacle member comprises a plurality of semiconductor obstacle members.

7. The system of claim 6, wherein the at least one semiconductor obstacle member comprises a plurality of semiconductor obstacle members arranged in a row along a length of the waveguide channel.

8. The system of claim 1, wherein the at least one semiconductor obstacle member comprises silicon, germanium, gallium arsenide, gallium nitride, silicon germanium, silicon carbide, indium phosphide, or gallium phosphide.

9. The system of claim 1, wherein the internal walls defining the waveguide channel and the at least one semiconductor obstacle member comprise a same semiconductor material.

10. The system of claim 1, wherein the internal walls defining the waveguide channel and the at least one semiconductor obstacle member comprise different semiconductor materials.

11. The system of claim 1, wherein the at least one semiconductor obstacle member is in the form of a post extending in a direction perpendicular to a planar direction defined by the semiconductor wafer.

12. The system of claim 1, wherein the waveguide assembly further comprises a window comprising an electromagnetic radiation (ER) transparent semiconductor layer terminating the at least one semiconductor obstacle member to allow for excitation of the at least one semiconductor obstacle member by applied electromagnetic radiation emitted by a source external to the semiconductor wafer.

13. The system of claim 12, wherein the at least one semiconductor obstacle member extends from the metallic layer lining the internal walls of the semiconductor wafer to the window.

14. The system of claim 12, wherein the ER transparent semiconductor layer comprises silicon nitride, silicon dioxide, indium tin oxide, or a transparent metal mesh film incorporated in a semiconductor support.

15. The system of claim 12, wherein the window has a diameter of from about 0.083 mm to about 0.450 mm and/or a diameter less than $\frac{1}{12}$th of a wavelength ($\lambda$) of the applied electromagnetic radiation.

16. The system of claim 1, further comprising an electromagnetic radiation (ER) emitter for emitting the applied electromagnetic radiation.

17. The system of claim 16, wherein the ER emitter comprises a light emitting diode (LED), a laser diode, or a vertical cavity surface emitting laser (VCSEL).

18. The system of claim 16, wherein the ER emitter is configured to emit electromagnetic radiation in the UV spectrum, the visible light spectrum, or the infrared spectrum.

19. The system of claim 1, wherein the waveguide channel is void of semiconductor material, other than semiconductor material of the at least one semiconductor obstacle member, between the metallic layer lining the internal walls that define the waveguide channel.

20. The system of claim 1, wherein the waveguide channel comprises semiconductor material, other than semiconductor material of the at least one semiconductor obstacle member, between the metallic layer lining the internal walls that define the waveguide channel.

* * * * *